United States Patent
Labaj et al.

(10) Patent No.: US 10,482,194 B1
(45) Date of Patent: Nov. 19, 2019

(54) SIMULATION MODE MODIFICATION MANAGEMENT OF EMBEDDED OBJECTS

(71) Applicant: EMC IP Holding Company LLC, Hopkinton, MA (US)

(72) Inventors: Donald E. Labaj, Northborough, MA (US); Norman M. Miles, Bedford, MA (US); Scott E. Joyce, Foxboro, MA (US); Timothy J. Cox, Mendon, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 874 days.

(21) Appl. No.: 14/108,653

(22) Filed: Dec. 17, 2013

(51) Int. Cl.
*G06F 11/26* (2006.01)
*G06F 17/50* (2006.01)
*G06F 16/25* (2019.01)

(52) U.S. Cl.
CPC ........ *G06F 17/5009* (2013.01); *G06F 11/261* (2013.01); *G06F 16/25* (2019.01); *Y10S 707/99931* (2013.01); *Y10S 707/99944* (2013.01)

(58) Field of Classification Search
None
See application file for complete search history.

(56) References Cited

U.S. PATENT DOCUMENTS

| | | | | |
|---|---|---|---|---|
| 7,478,026 B1* | 1/2009 | Kushner | ............ | G06F 17/5009 703/13 |
| 7,725,473 B2* | 5/2010 | Lamb | ............ | H04L 67/1097 707/758 |
| 8,024,171 B1* | 9/2011 | Korolev | ............ | G06F 11/366 703/13 |
| 8,250,257 B1* | 8/2012 | Harel | ............ | G06F 3/061 710/38 |
| 8,302,201 B1* | 10/2012 | Gupta | ............ | H04L 63/101 711/100 |
| 8,442,998 B2* | 5/2013 | Mansfield | ............ | G06F 17/218 707/791 |
| 8,589,659 B1* | 11/2013 | Shapiro | ............ | G06F 3/0641 707/827 |

(Continued)

OTHER PUBLICATIONS

U.S. Appl. No. 13/798,545, filed Mar. 13, 2013, Joyce, et al.
U.S. Appl. No. 13/627,195, filed Sep. 26, 2012, Tang, et al.
U.S. Appl. No. 13/626,299, filed Sep. 25, 2012, Joyce, et al.

*Primary Examiner* — Kibrom K Gebresilassie
(74) *Attorney, Agent, or Firm* — Muirhead and Saturnelli, LLC

(57) ABSTRACT

Described are techniques for processing a request. Data storage system configuration information is provided which is used by a simulator that simulates a data storage system configuration of a data storage system. A request is received to perform an operation with respect to the data storage system configuration being simulated. The request identifies an object included in the data storage system configuration information used to simulate the data storage system configuration. First processing is performed to simulate servicing the request using the data storage system configuration information and the first processing includes determining, at run time while processing the request, whether the object includes a first object property that is a reference to an embedded object.

22 Claims, 14 Drawing Sheets

(56) References Cited

U.S. PATENT DOCUMENTS

| | | | | |
|---|---|---|---|---|
| 8,635,594 B1* | 1/2014 | Krishnan | G06F 9/45512 | 707/609 |
| 8,635,707 B1* | 1/2014 | Parenti | G06F 21/6218 | 713/182 |
| 8,812,423 B1* | 8/2014 | Kurniawati | G06F 21/6218 | 706/47 |
| 8,924,595 B1* | 12/2014 | Joyce | G06F 11/261 | 710/5 |
| 8,938,477 B1* | 1/2015 | Tang | G06F 16/21 | 707/803 |
| 8,949,281 B2* | 2/2015 | van Rotterdam | G06F 17/30961 | 707/802 |
| 8,996,482 B1* | 3/2015 | Singh | G06F 17/30575 | 707/698 |
| 9,047,352 B1* | 6/2015 | Dong | G06F 16/144 | |
| 9,104,434 B2* | 8/2015 | Miadowicz | G06F 8/443 | |
| 9,244,632 B1* | 1/2016 | Foley | G06F 3/0689 | |
| 9,336,340 B1* | 5/2016 | Dong | G06F 17/50 | |
| 9,871,889 B1* | 1/2018 | Daruwalla | H04L 67/42 | |
| 2002/0103889 A1* | 8/2002 | Markson | H04L 67/1097 | 709/223 |
| 2004/0078654 A1* | 4/2004 | Holland | G06F 16/289 | 714/13 |
| 2004/0186837 A1* | 9/2004 | Lambert | G06F 3/0607 | |
| 2005/0055326 A1* | 3/2005 | Thusoo | G06F 17/30011 | |
| 2005/0223047 A1* | 10/2005 | Shah | G06F 17/30176 | |
| 2006/0059307 A1* | 3/2006 | Fujibayashi | G06F 3/0622 | 711/114 |
| 2006/0095885 A1* | 5/2006 | Agrawal | H04L 41/145 | 716/102 |
| 2006/0129781 A1* | 6/2006 | Gellai | G06F 3/0605 | 711/170 |
| 2006/0174155 A1* | 8/2006 | Mansell | G06F 11/3696 | 714/5.11 |
| 2008/0147859 A1* | 6/2008 | Fujita | G06F 3/0605 | 709/225 |
| 2010/0312753 A1* | 12/2010 | Miyamae | G06F 11/1471 | 707/674 |
| 2011/0082837 A1* | 4/2011 | Cherkasova | G06F 11/1461 | 707/654 |
| 2011/0202504 A1* | 8/2011 | Cherkasova | G06F 11/1451 | 707/654 |
| 2011/0295811 A1* | 12/2011 | Cherkasova | G06F 11/3419 | 707/654 |
| 2012/0029899 A1* | 2/2012 | Dorfel | G06F 11/3457 | 703/21 |
| 2013/0152088 A1* | 6/2013 | Gkantsidis | G06F 16/24 | 718/100 |
| 2013/0212134 A1* | 8/2013 | S | H04L 67/1097 | 707/827 |
| 2014/0180664 A1* | 6/2014 | Kochunni | G06F 11/3442 | 703/21 |
| 2014/0297624 A1* | 10/2014 | Jarvis | G06F 17/30528 | 707/722 |
| 2015/0067658 A1* | 3/2015 | Hahnenberg | G06F 12/0815 | 717/148 |
| 2015/0178057 A1* | 6/2015 | Miadowicz | G06F 8/443 | 717/151 |

* cited by examiner

SIMULATION MODE MODIFICATION MANAGEMENT OF EMBEDDED OBJECTS

BACKGROUND

Technical Field

This application relates to techniques used in connection with management of information during simulation whereby the simulation may modify such information.

Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more servers or host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. The host systems access the storage device through a plurality of channels provided therewith. Host systems provide data and access control information through the channels to the storage device and the storage device provides data to the host systems also through the channels. The host systems do not address the disk drives of the storage device directly, but rather, access what appears to the host systems as a plurality of logical disk units. The logical disk units may or may not correspond to the actual disk drives. Allowing multiple host systems to access the single storage device unit allows the host systems to share data in the device. In order to facilitate sharing of the data on the device, additional software on the data storage systems may also be used.

Management software may be used in connection with management of data storage systems. The management software, as well as more generally any software, may obtain inputs used in connection with performing an operation or task. For example, user inputs may be obtained using a user interface. The management software may be characterized as a client which issues requests to a server, such as a data storage system, in connection with performing requested operations.

SUMMARY OF THE INVENTION

In accordance with one aspect of the invention is a method for processing a request comprising: providing data storage system configuration information used by a simulator that simulates a data storage system configuration of a data storage system; receiving a request to perform an operation with respect to the data storage system configuration being simulated, said request identifying an object included in the data storage system configuration information used to simulate the data storage system configuration; and performing first processing to simulate servicing the request using the data storage system configuration information, said first processing including: determining, at run time while processing the request, whether the object includes a first object property that is a reference to an embedded object. The request may be a request to read first information regarding a current configuration of the data storage system. Simulation of the request may be performed by reading at least some of the data storage system configuration information, and the first processing may further include responsive to determining that the object includes the first object property that is a reference to an embedded object, performing processing to retrieve object properties and associated values of the embedded object and to include retrieved object properties and associated values of the embedded object in information returned to a sender which issued the request. The request may be a request to perform any of a get operation returning information regarding the data storage system configuration to a user interface for display, a create operation to create a new instance of an entity in the data storage system configuration, an update operation to update an existing instance of an entity in the data storage system configuration, and a delete operation to delete an existing instance of an entity in the data storage system configuration. The simulator may simulate servicing requests in connection with performing a data storage management operation. The simulator may perform processing to simulate requests including the request as if performed by a data storage system in accordance with the data storage system configuration information simulating at least some entities of a current configuration of the data storage system. The data storage system configuration information may be used to simulate the current data storage system configuration using an object model and may include an object for each of a plurality of logical and physical entities of the data storage system being simulated. The object model may include a plurality of object types and each of the plurality of logical and physical entities may be one of the plurality of object types. The plurality of object types may include any of a physical storage device, a logical storage device, a RAID group, a storage group, a physical component of the data storage system being simulated, and a logical component of the data storage system being simulated. The object may be a first object type and an object model definition file describing objects of the first object type may be used in determining whether the first object property is a reference to an embedded object. The object model definition file may include type information for each object property of the first object type. The type information may identify, for said each object property, whether said each object property is a reference to another object type of an embedded object. The request may be a request to write first information regarding a current configuration of the data storage system, wherein simulation of the request to simulate updating the current configuration may be performed by writing at least some of the data storage system configuration information. The first processing may further include responsive to determining that the object includes the first object property that is a reference to an embedded object, performing processing to write one or more property values corresponding to one or more object properties of any of the object and the embedded object. The object may be a first object including the first object property that is a reference to the embedded object and a second object included in the data storage system configuration information may include a second object property that is a reference to the embedded object. The first object property of the first object and the second object property of the second object may each have a first value that is an identifier used as a reference to a same set of information indicating object properties and associated property values of the embedded object. The object may be a first of a plurality of object types and wherein the data storage system configuration information may include a plurality of files. Each of the plurality of object types may correspond to one of the plurality of files whereby said one file may provide object properties and associated object property values for objects of said each object type included in the data storage system configuration information. Each of the plurality of object types may identify a different object type corresponding to a type of entity simulated using the data storage system configuration information. Each of the plurality of object types may have a corresponding object model definition file used in determining whether a property of a first object of said each object type is a reference to an embedded object.

In accordance with another aspect of the invention is a computer readable medium comprising code stored thereon for processing a request the computer readable medium comprising code for: providing data storage system configuration information used by a simulator that simulates a data storage system configuration of a data storage system; receiving a request to perform an operation with respect to the data storage system configuration being simulated, said request identifying an object included in the data storage system configuration information used to simulate the data storage system configuration; and performing first processing to simulate servicing the request using the data storage system configuration information, said first processing including: determining, at run time while processing the request, whether the object includes a first object property that is a reference to an embedded object. The request may be a request to read first information regarding a current configuration of the data storage system, wherein simulation of the request may be performed by reading at least some of the data storage system configuration information. The first processing may further include responsive to determining that the object includes the first object property that is a reference to an embedded object, performing processing to retrieve object properties and associated values of the embedded object and to include retrieved object properties and associated values of the embedded object in information returned to a sender which issued the request. The request may be a request to perform any of a get operation returning information regarding the data storage system configuration to a user interface for display, a create operation to create a new instance of an entity in the data storage system configuration, an update operation to update an existing instance of an entity in the data storage system configuration, and a delete operation to delete an existing instance of an entity in the data storage system configuration. The simulator may simulate servicing requests in connection with performing a data storage management operation. The simulator may perform processing to simulate requests including the request as if performed by a data storage system in accordance with the data storage system configuration information simulating at least some entities of a current configuration of the data storage system. The data storage system configuration information used to simulate the current data storage system configuration may use an object model and may include an object for each of a plurality of logical and physical entities of the data storage system being simulated. The object model may include a plurality of object types, each of said plurality of logical and physical entities being one of the plurality of object types. The plurality of object types may include any of a physical storage device, a logical storage device, a RAID group, a storage group, a physical component of the data storage system being simulated, and a logical component of the data storage system being simulated.

In accordance with another aspect of the invention is a system comprising: a data storage system including: a data store of configuration data indicating a current data storage configuration of the data storage system; and a first computer readable medium including code stored thereon, the first computer readable medium including code for: servicing command requests in connection with data storage system management operations; and a management system including a second computer readable medium with code of a data storage system management application thereon, the data storage management application including code for: a user interface that issues requests to first code; said first code that receives requests from the user interface and determines at runtime whether to simulate received requests using a simulator, or whether to service the received requests by issuing the received requests to the data storage system for servicing in a non-simulation mode; said simulator that simulates requests, said simulator simulating processing performed to service requests as if performed by the data storage system, said simulator using data storage configuration information for simulating at least part of a data storage system configuration of the data storage system; and wherein the second computer readable medium further includes code for: receiving a first request to perform an operation with respect to the data storage system configuration being simulated, said request identifying an object included in the data storage system configuration information used to simulate the data storage system configuration; and performing first processing to simulate servicing the request using the data storage system configuration information, said first processing including: determining, at run time while processing the request, whether the object includes a first object property that is a reference to an embedded object.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
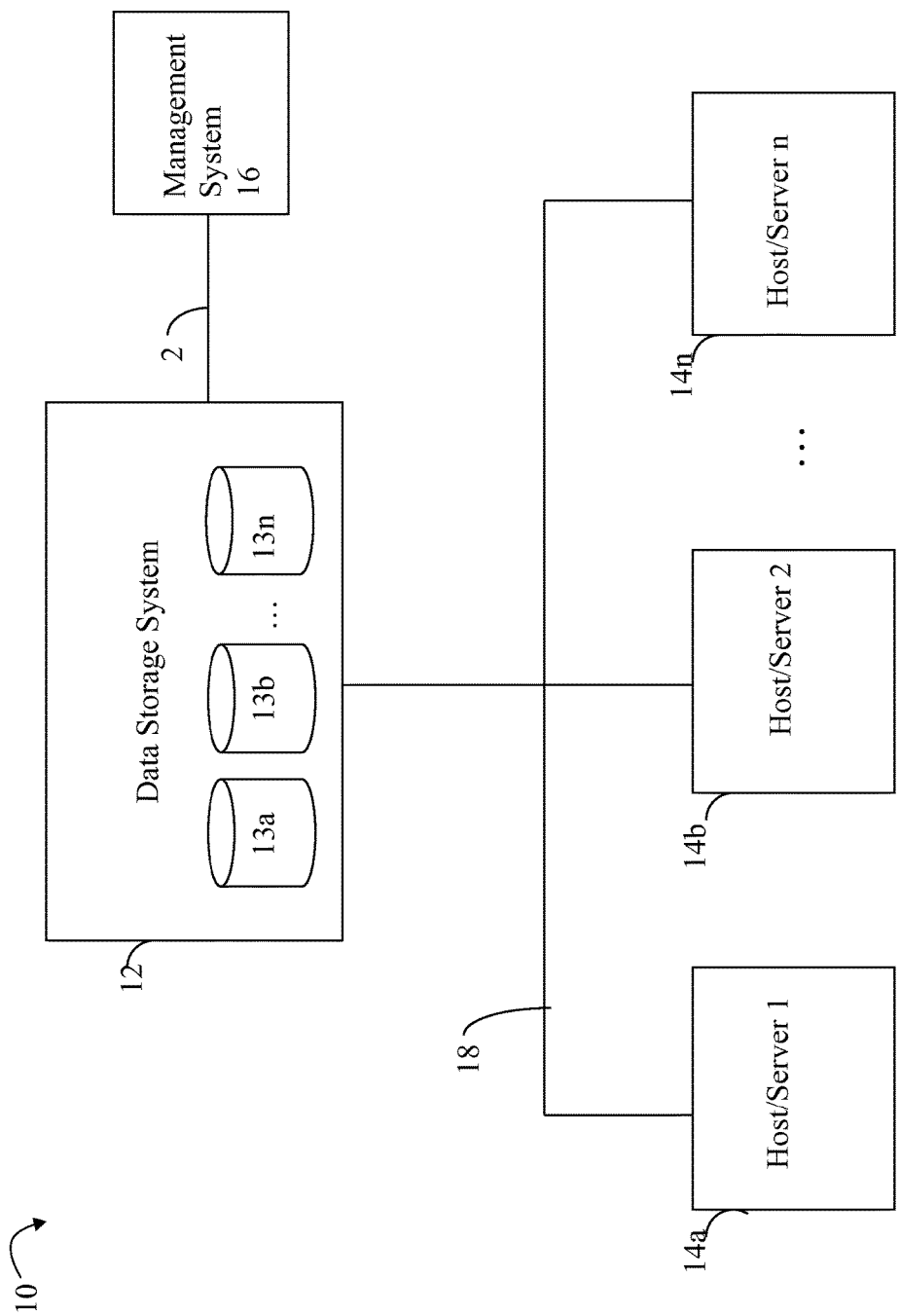
FIG. 1 is an example of an embodiments of a system that may utilize the techniques described herein.

Referring to FIG. 1, shown is an example of an embodiment of a system that may be used in connection with performing the techniques described herein. The system 10 includes one or more data storage systems 12 connected to server or host systems 14a-14n through communication medium 18. The system 10 also includes a management system 16 connected to one or more data storage systems 12 through communication medium 2. In this embodiment of the system 10, the management system 16, and the N servers or hosts 14a-14n may access the data storage systems 12, for example, in performing input/output (I/O) operations, data requests, and other operations. The communication medium 18 may be any one or more of a variety of networks or other type of communication connections as known to those skilled in the art. Each of the communication mediums 18 and 2 may be a network connection, bus, and/or other type of data link, such as a hardwire or other connections known in the art. For example, the communication medium 18 may be the Internet, an intranet, network or other wireless or other hardwired connection(s) by which the host systems 14a-14n may access and communicate with the data storage systems 12, and may also communicate with other components (not shown) that may be included in the computer system 10. In one embodiment, the communication medium 2 may be a LAN connection and the communication medium 18 may be an iSCSI or fibre channel (FC) connection.

Each of the host systems 14a-14n and the data storage systems 12 included in the system 10 may be connected to the communication medium 18 by any one of a variety of connections as may be provided and supported in accordance with the type of communication medium 18. Similarly, the management system 16 may be connected to the communication medium 2 by any one of variety of connections in accordance with the type of communication medium 2. The processors included in the host computer systems 14a-14n and management system 16 may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage systems 12 are described herein in more detail, and may vary with each particular embodiment. Each of the host computers 14a-14n, the management system 16 and data storage systems may all be located at the same physical site, or, alternatively, may also be located in different physical locations. In connection with communication mediums 18 and 2, a variety of different communication protocols may be used such as SCSI, Fibre Channel, iSCSI, and the like. Some or all of the connections by which the hosts, management system, and data storage system may be connected to their respective communication medium may pass through other communication devices, such as switching equipment that may exist such as a phone line, a repeater, a multiplexer or even a satellite. In one embodiment, the hosts may communicate with the data storage systems over an iSCSI or a Fibre Channel connection and the management system may communicate with the data storage systems over a separate network connection using TCP/IP. It should be noted that although FIG. 1 illustrates communications between the hosts and data storage systems being over a first connection, and communications between the management system and the data storage systems being over a second different connection, an embodiment may also use the same connection. The particular type and number of connections may vary in accordance with particulars of each embodiment.

Each of the host computer systems may perform different types of data operations in accordance with different types of tasks. In the embodiment of FIG. 1, any one of the host computers 14a-14n may issue a data request to the data storage systems 12 to perform a data operation. For example, an application executing on one of the host computers 14a-14n may perform a read or write operation resulting in one or more data requests to the data storage systems 12.

The management system 16 may be used in connection with management of the data storage systems 12. The management system 16 may include hardware and/or software components. The management system 16 may include one or more computer processors connected to one or more I/O devices such as, for example, a display or other output device, and an input device such as, for example, a keyboard, mouse, and the like. A data storage system manager may, for example, view information about a current storage volume configuration on a display device of the management system 16, provision data storage system resources, and the like.

In one embodiment, the data storage systems 12 may include one or more data storage systems such as one or more of the data storage systems, such as data storage arrays, offered by EMC Corporation of Hopkinton, Mass. Each of the data storage systems may include one or more data storage devices 13a-13n, such as disks. One or more data storage systems may be manufactured by one or more different vendors. Each of the data storage systems included in 12 may be inter-connected (not shown). Additionally, the data storage systems may also be connected to the host systems through any one or more communication connections that may vary with each particular embodiment and device in accordance with the different protocols used in a particular embodiment. The type of communication connection used may vary with certain system parameters and requirements, such as those related to bandwidth and throughput required in accordance with a rate of I/O requests as may be issued by the host computer systems, for example, to the data storage systems 12. It should be noted that each of the data storage systems may operate stand-alone, or may also be included as part of a storage area network (SAN) that includes, for example, other components such as other data storage systems. Each of the data storage systems may include a plurality of disk devices or volumes 13a-13n. The particular data storage systems and examples as described herein for purposes of illustration should not be construed as a limitation. Other types of commercially available data storage systems, as well as processors and hardware controlling access to these particular devices, may also be included in an embodiment.

Servers or host systems, such as 14a-14n, provide data and access control information through channels to the storage systems, and the storage systems may also provide data to the host systems also through the channels. The host systems may not address the disk drives of the storage systems directly, but rather access to data may be provided to one or more host systems from what the host systems view as a plurality of logical devices or logical volumes (LVs). The LVs may or may not correspond to the actual disk drives. For example, one or more LVs may reside on a single physical disk drive. Data in a single storage system may be accessed by multiple hosts allowing the hosts to share the data residing therein. An LV or LUN (logical unit number) may be used to refer to the foregoing logically defined devices or volumes.

Figure 2:
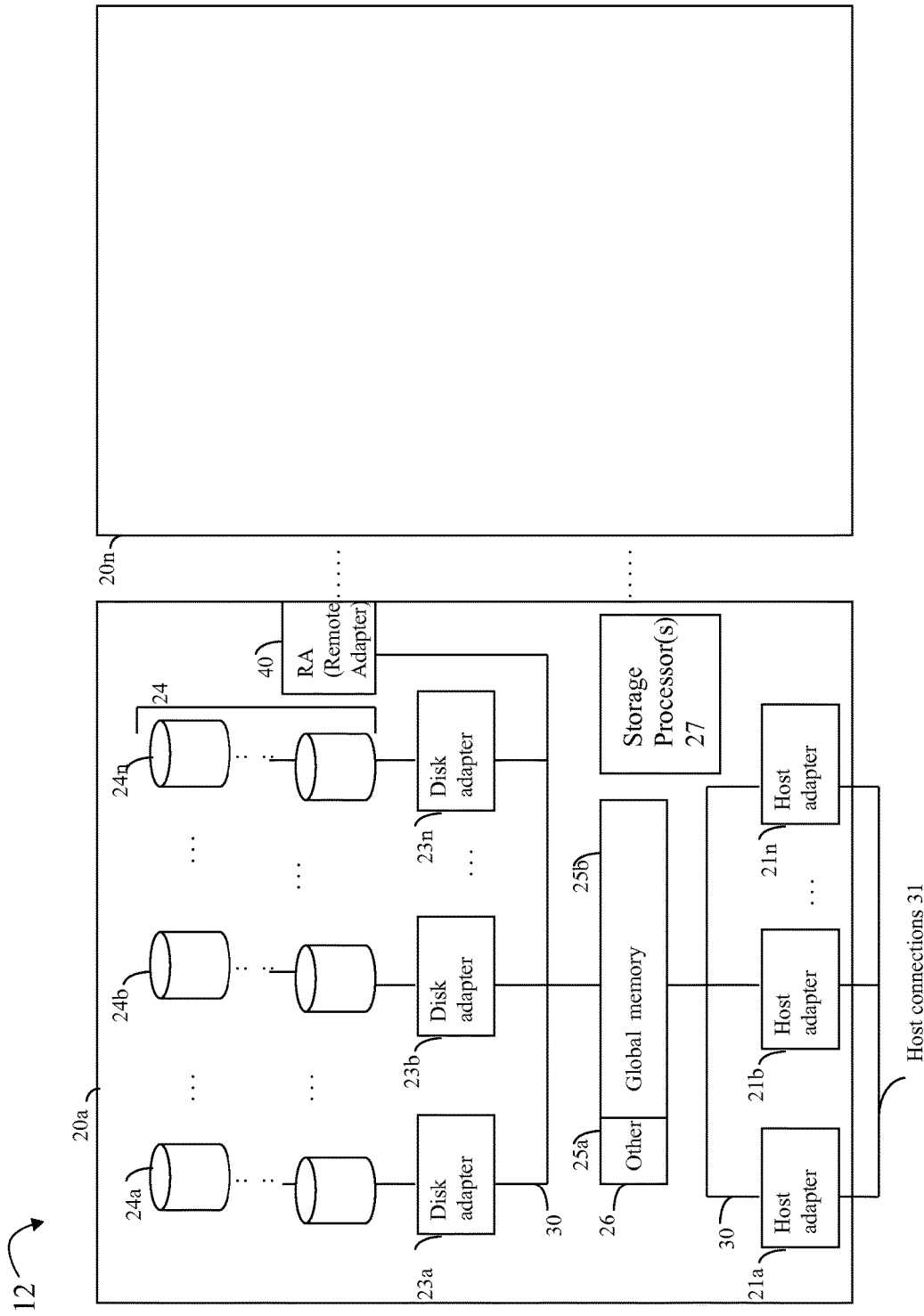
FIG. 2 is an example illustrating details of a data storage system in accordance with techniques herein.

Referring to FIG. 2, shown is an example of an embodiment of the data storage system 12 that may be included in the system 10 of FIG. 1. Included in the data storage system 12 of FIG. 2 are one or more data storage systems 20a-20n as may be manufactured by one or more different vendors. Each of the data storage systems 20a-20n may be a data storage array inter-connected (not shown) to other data storage array(s). Additionally, as noted above, the data storage systems may also be connected to the host systems through any one or more communication connections 31.

Each of the data storage systems, such as 20a, may include a plurality of storage devices such as disk devices or volumes included in an arrangement 24 consisting of n rows of disks or more generally, data storage devices, 24a-24n. In this arrangement, each row of disks may be connected to a disk adapter ("DA") or director responsible for the backend management of operations to and from a portion of the disks 24. In the system 20a, a single DA, such as 23a, may be responsible for the management of a row of disks, such as row 24a. In a data storage system such as by EMC Corporation, a backend DA may also be referred to as a disk controller. The DA may performed operations such as reading data from, and writing data to, the physical devices which are serviced by the DA.

Also shown in the storage system 20a is an RA or remote adapter 40. The RA may be hardware including a processor used to facilitate communication between data storage systems, such as between two of the same or different types of data storage systems.

The system 20a may also include one or more storage processors 27. Each of the storage processors 27 may be a CPU and an embodiment may include any number of such processors. For example, the VNX® data storage system by EMC Corporation includes two storage processors. The system 20a may also include one or more host adapters ("HAs") or directors 21a-21n. Each of the HAs may be used to manage communications and data operations between one or more host systems and the global memory. In an embodiment, the HA may be a Fibre Channel Adapter (FA) or other adapter which facilitates host communication. The HA communicates with a component of the host such as a host bus adapter (HBA). Generally, directors may also be characterized as the different adapters, such as HAs (including FAs), DAs RAs and the like, as described herein. Components of the data storage system, such as an HA, which may communicate with a host may also be referred to as front end components. Within the data storage system, components, which may be characterized as backend components, communicate with a front end component. An example of a backend component is a DA. In connection with data storage systems such as by EMC Corporation, various types of directors or adapters may be implemented as a processor, or, more generally, a component that includes the processor. Examples of directors are disk adapters (DAs), host adapters (HAs), and the like.

One or more internal logical communication paths may exist between the DAs, the RAs, the HAs, and the memory 26. An embodiment, for example, may use one or more internal busses or other internal connections 30 and/or communication modules. For example, the global memory portion 25b may be used to facilitate data transfers and other communications between the DAs, HAs and RAs in a data storage system. In one embodiment, the DAs 23a-23n may perform data operations using a cache that may be included in the global memory 25b, for example, in communications with other disk adapters or directors, and other components of the system 20a. The other portion 25a is that portion of memory that may be used in connection with other designations that may vary in accordance with each embodiment.

The particular data storage system as described in this embodiment, or a particular device thereof, such as a disk, should not be construed as a limitation. Other types of commercially available data storage systems, as well as processors and hardware controlling access to these particular devices, may also be included in an embodiment.

Management software may execute on the data storage system and/or management system. A client, such as a user interface (UI) of the data storage system management software included in the management system 16, may be used by an administrator in connection with performing data storage management operations. For example, the administrator may view information using a graphical UI (GUI) regarding the current data storage configuration, may perform an operation such as create or configure a logical entity such as a RAID group, LUN or LV, storage group (SG) of one or more LUNs, and the like. A logical entity such as a RAID group may be represented by an object having attributes such as indicating a RAID level of the RAID group (e.g., RAID-0, 1, 5, or 6), a number of data and/or parity drives, and the like.

During operation of the data storage system management application, the GUI may issue a command request such as in the form of an API call to first code that performs processing to service the command request. The first code of the API may further perform other calls to lower software layers which result in a request being issued to the data storage system to service the command request. The command request from the GUI may be, for example, in response to a request to obtain (e.g., read) data storage management information from the data storage system for display, to perform an operation such as described above and elsewhere herein which results in a modification to existing data storage configuration data (e.g., write to update existing object) describing the configuration of the data storage system, and the like.

As described herein, simulation may be performed in connection with servicing the command request rather than servicing the command request in non-simulation mode by forwarding to the data storage system. An embodiment in accordance with techniques herein may support simulating the command request. Such simulation may be performed for a variety of different purposes. For example, providing for such simulation used in connection with the GUI may allow testing and use of the GUI and management application without requiring the physical data storage system. Such simulation may be performed, for example, by a client system including the management application whereby the client further includes software to perform the simulation using a set of configuration data used to simulate the data storage system configuration. In this manner, a user (e.g., customer or software developer of the management application) may use the management application and its GUI without requiring an actual data storage system and data storage system environment. Code of the GUI may be tested using the simulation mode. More generally, simulation mode may be used to test software included in the client-side management application without requiring use of a data storage system.

As will be described in following paragraphs, techniques herein provide for use of a simulator for servicing command requests such as may be issued by code of the GUI in connection with a user's request, for example, to display information regarding the data storage system and its configuration, modify existing information regarding the data storage system configuration, and the like. In accordance with techniques herein, such requests may be serviced using simulation rather than issuing the request to the data storage system for actual service in non-simulation mode. Command requests may be issued by an application, such as a management application, to code of an application programming interface (API). The API code invoked, and possibly lower software layers, may facilitate communications with the data storage system when in non-simulation mode. When in simulation mode, such requests may be alternatively be serviced using simulation thereby allowing for the GUI of the management application to be utilized and tested for all supported command requests even though the underlying invoked software of the API code may not be fully implement or capable of servicing all such command requests. When the command request is serviced using simulation, the simulator services the command request using configuration data that simulates a data storage system configuration and the simulator also simulates operations performed with respect to this configuration. When a command request is serviced in a non-simulated mode, the command request may be forwarded to actual data storage system for processing in the usual mode of operation thereby requiring the actual data storage system hardware and software and an actual associated data storage system configuration.

Simulation mode provides, for example, simulating modifications made to a data storage system configuration and simulating calls made between lower software layers in the runtime stack as a result of a GUI of a data storage management application issuing a command request to perform an operation. For example, the GUI may issue a command request to an API to perform an operation, such as obtain data storage configuration information for display, perform an operation causing a modification to the existing data storage configuration (e.g., create a new logical entity of the configuration, modify an existing entity of the data storage configuration), and the like. Such API calls may be characterized as simulated if they are performed without using an actual data storage system (e.g., no data storage system hardware required or used) and without the API code performing calls to a data storage system to service the command request. Such API calls to the data storage system may be simulated using a previously generated set of data storage configuration data. In response to a request made through the GUI of the data storage management application, the request to perform a command may be serviced by simulating such calls, simulating the data storage system and its configuration, and simulating any data storage system configuration operations. As described in more detail below, in some instances, it may be desirable to service command requests (e.g., as may be issued as an API call) using simulated configuration data and simulating servicing of the command request using a simulator as if serviced by code of the data storage system using its actual data storage configuration data. As described in more detail in following paragraphs, the command request issued by the GUI may be, for example to view information regarding logical and/or physical data storage system entities of the data storage configuration (e.g., list physical storage devices and associated properties and statuses, list logical storage entities such as logical devices having storage provisioned on physical storage devices, list properties of such logical devices), perform an operation (e.g., create, delete, modify) with respect to a logical storage entity (e.g., logical storage device, storage group of one or more logical storage devices)) of the configuration, and the like.

An embodiment in accordance with techniques herein may provide for turning on or off simulation mode for a selected portion of one or more commands or all command requests. For example, an embodiment may provide for specifying an option to selectively disable or enable simulating particular command requests even though the simulator may include functionality to perform such command request simulations. An embodiment may also provide an option to turn on or off simulation mode for all commands independent of whether there is a physical data storage system connected and available. An embodiment may also provide for automatically turning on or off simulation mode for processing command requests in response to certain conditions. For example, an embodiment may provide for automatically detecting whether there is a connection to a physical data storage system to service a command request in non-simulation mode. If such a connection is not available, all command requests may be issued using simulation. There may also be other instances where it may be desirable to service command requests using simulation even though the command request may be capable of being serviced using non-simulation mode whereby the system has capability and full functionality to service the command request using a live data storage system.

Figure 3:
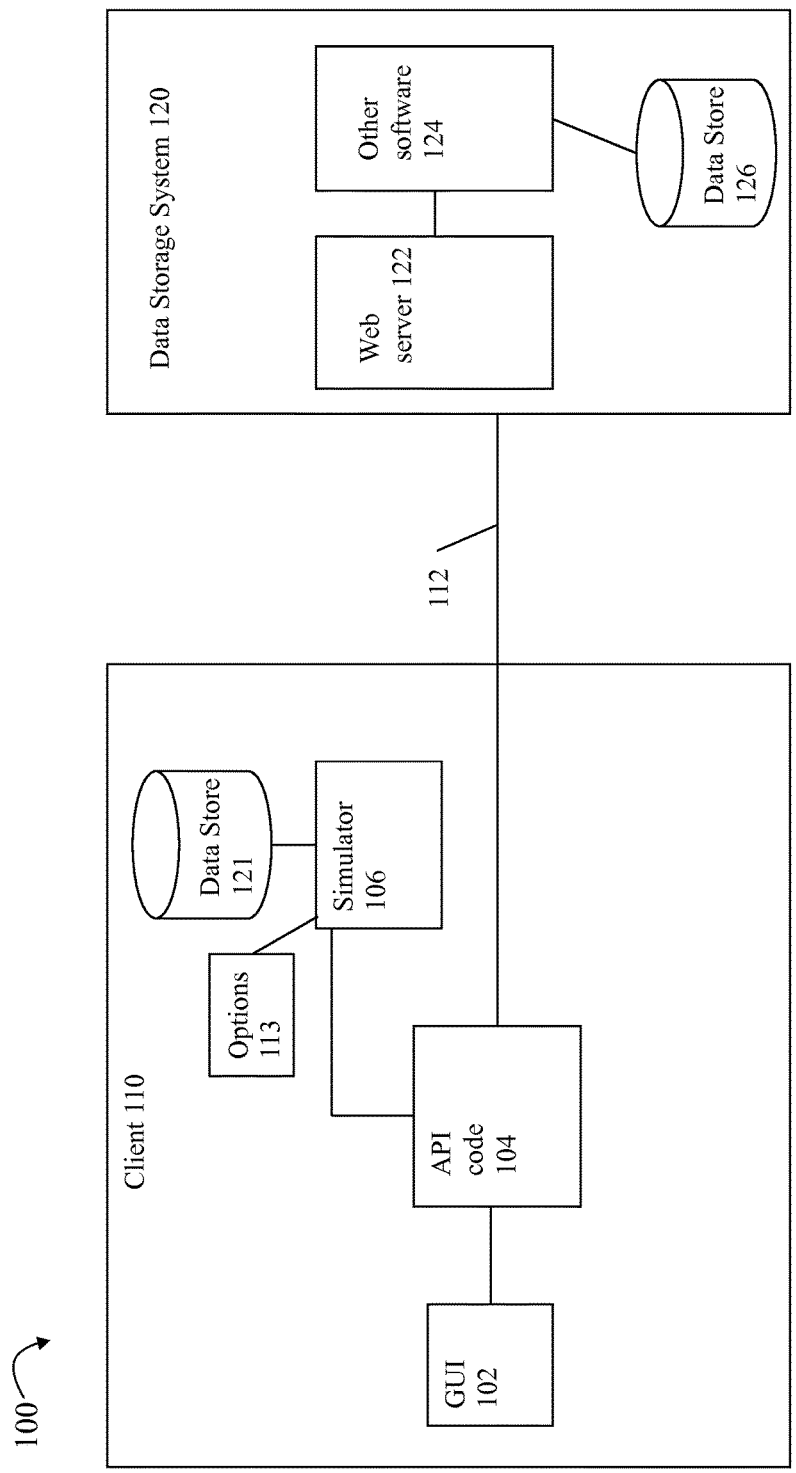
FIG. 3 is an example of components of a client and server of an embodiment that may utilize techniques described herein.

Referring to FIG. 3, shown is an example of components that may be included in an embodiment in accordance with techniques herein. The example 100 includes a client 110 and data storage system 120. The client 110 may be, for example, data storage management software executing on the management system 16 or other computer system or management device. The management software, or more generally client 110, may include code providing a GUI 102, API (application programming interface) code 104 and a simulator 106. The GUI 102 may issue a command in the form of an API call to the API code 104 to perform an operation. For example, the GUI 102 may issue a command to get a list of LUNs or physical storage devices and associated properties whereby the information returned in response to the command will be displayed on a display device or otherwise communicated to the user. The command may be issued in response to a user's request for particular information whereby the request is made via user-input(s) such as from one or more menu selections or other UI elements. The command from GUI 102 may be an API call to API code 104. The API code 104 performs processing to determine whether to use the simulator 106 to service the command request, or otherwise issue a command to the data storage system 120 to service the command request. The API code 104 may be invoked in connection with any one of a set of commands that may possibly be issued from the GUI 102.

For purposes of simplicity of illustration and explanation in some exemplary embodiments described herein, assume that an embodiment provides at least a first setting or option to indicate whether simulation is enabled or disabled for all command requests. It will be appreciated that other variations an options for enabling or disabling simulation mode are possible, some of which are described elsewhere herein.

If the foregoing first setting indicates that simulation mode is enabled, the API code 104 uses the simulator 106 to simulate a data storage system and its configuration thereby utilizing configuration data of the data store 121. When simulation mode is disabled thereby indicating to not service command requests using simulation, the API code 104 does not use the simulator 106 and rather issues the commands to the data storage system 120 over connection 112 (which may be a network connection) for processing. The processing performed to service the commands in non-simulation mode provides for servicing the command in real-time through communication with the data storage system. The data storage system 120 then performs processing to service the command and return any requested information to the API code 104. In accordance with techniques herein, the information returned to the API code 104 as a result of servicing a command may be the same whether the information is returned from the data storage system 120 when operating in a non-simulated mode or whether the information is returned from the simulator 106 when operating in a simulated mode. The foregoing determination made by the API code 104 of whether to service a command request using the simulator 106 (thereby simulating the data storage system and its configuration), or whether to service the command requested by issuing the request to the data storage system 120 (thereby operating in an non-simulating mode where the command is serviced by the data storage system having a data storage configuration) may be performed at runtime while executing code of the data storage management application including GUI 102.

An embodiment may include options 113 read as an input by the simulator 106. The options 113 may include information specifying which one or more command requests for which simulation mode is disabled/serviced using non-simulation mode even if the simulator includes functionality for simulating the identified command requests. In this manner, such identified command requests having simulation mode disabled may always be serviced using non-simulation mode (e.g., without using the simulator 106 and alternatively serviced by issuing the request to the data storage system for servicing using its configuration data). If the simulator 106 includes functionality to simulate a command request and simulation for the command request is not otherwise disabled by the options 113, the command request may be simulated by the simulator 106. For example, the options file 113 may include a setting to enable or disable simulation for all command requests, one or more particular commands, and the like, depending on the level of simulation control enablement provided in an embodiment.

In one embodiment, the simulator 106 may read the options file 113 indicating whether simulation mode is enabled or disabled for some or all commands. During runtime, the API code 104 may communicate with the simulator to determine whether simulation is enabled or disabled and accordingly process the command. If enablement or disablement of simulation is performed on a global level for all commands, the API code 104 may communicate with the simulator 106 for such global settings or options, for example, on start up or initialization of the API code 104 and/or simulator 106. Alternatively, if an embodiment provides for dynamically modifying the options file 113 at runtime whereby enablement or disablement of simulation may be modified during runtime, the API code 104 may communicate with the simulator 106 regarding simulation settings responsive to each received command. The foregoing and other variations will be appreciated by those skilled in the art.

In this manner, the management application may be executed and include a GUI or other user interface. The GUI 102 may issue a command request to API code 104 which determines whether to service the command using simulation or non-simulation mode. If serviced using simulation, the simulator 106 may be invoked to provide a simulated data storage system and configuration to service the command request. Otherwise, the command request may be serviced using non-simulation by issuing one or more requests to the actual data storage system for processing using its defined data storage system configuration.

In connection with the data storage management software, or more generally, any software of a client 110, various user inputs may be obtained in connection with performing a requested operation. For example, a user may select an operation to be performed in connection with data storage management. The user may also provide additional inputs specifying parameters for the operation using the GUI in connection with performing the requested operation. When servicing a command to perform an operation in a non-simulation mode, the management software may be characterized as a client 110 which issues requests on behalf of a user to the data storage system 120 to perform a data storage management operation or task such as, for example, view selected portions of data storage configuration information regarding a current configuration and state of the data storage system (e.g., list of currently defined LUNs, SGs of LUNs (e.g., an SG may be a logical entity of one or more associated LUNs), and the like), and create or modify the current data storage configuration (e.g., configure or provision physical storage for new LUNs from one or more physical devices (PDs), create or configure new RAID groups, create a new SG, modify an existing SG such as by adding or removing LUNs, and the like). In connection with such requests received at the data storage system from the management software, the management software may be characterized as a client requesting an operation or service of the data storage system, whereby the data storage system may service the request thereby functioning generally as a server. A client request may be processed and issued to the data storage system 120. The data storage system 120 may include software that services the command request and may return information, if any, to the client 110 in accordance with the particular command request. When servicing a command operating in simulation mode, the management software may be characterized as a client 110 which issues requests on behalf of a user to the simulator 106 which simulates servicing of the command request as if performed by the data storage system using simulated configuration data included in data store 121.

The associated runtime path when executing in simulation mode may include the API code 104 invoking the simulator 106 to service a command request from the GUI 102. The simulator 106 may perform processing to service the command request using simulator configuration data rather using actual configuration data obtained from the data storage system 120. In this manner, the simulator 106 may simulate the presence of a data storage system and its configuration using data of data store 121 and may also simulate services performed by the data storage system in connection with servicing the command request from the GUI 102. Such simulation may have a variety of different suitable uses and applications such as, for example, when testing client-side software, or portions of the client-side software, without requiring the hardware and/or software of a data storage system.

The GUI 102 may generally be characterized as providing the UI for the management software or client 110. For example, the GUI 102 may display screenshots including various UI elements (e.g., menus, buttons, navigation or hyperlinks, and the like). The UI elements may provide for different user interactions. For example, a UI element may be a menu from which a user makes a selection to perform an operation, select parameters for the request, and the like. The GUI 102 may include code for creating the particular UI elements, displaying information and UI elements to the user, interacting with the user, and the like. For example, the GUI 102 may include code for implementing a UI including particular UI elements for a menu, menu items, tables, and the like. The UI elements may include a menu from which a user may select a menu item to perform a particular operation such as display a table of LUNs and properties for those LUNs. In one embodiment, object-based models may be used. For example, each physical and/or logical entity used by the client may be represented by a corresponding object having a set of properties. Each LUN, PD, SG, and the like, may be represented by an object having property values for that particular represented entity. For example, a PD may be a disk having a PD object with properties values based on the physical disk. The disk may have a storage capacity, unique identifier (ID), and type (e.g., FC 10K RPM rotating disk, FC 15K RPM rotating disk, flash or SSD storage device, and the like) where the property values of the PD object are set to denote those particular characteristics for the physical disk being represented.

The GUI 102 may issue a command to the API code 104 that is a request to perform an operation. The command may include one or more parameters. For example, the GUI 102 may issue a command to obtain and return a list of LUNs and one or more selected LUN properties of these LUNs. In turn, the command may be serviced using a simulated data storage system and simulated data storage system configuration as provided by the simulator 106, or the command may alternatively be serviced in a non-simulated mode whereby the command may be issued to the data storage system which performs processing to service the request. The processing performed by the data storage system may be performed in accordance with the actual data storage configuration of data storage system and its current state of various hardware and software components rather than using simulated data storage configuration data. When operating in non-simulation mode, operations which modify (e.g., create, delete, update) objects representing entities of the data storage system configuration result in changes to the actual configuration of the data storage system 120. Similarly, when operating in simulation mode to service a command, such operations to modify objects representing entities in the data storage system configuration may result in changes to the simulated data storage system configuration of data store 121 (e.g., modify the set of data configuration data as stored and used by the simulator 106 representing a modeled data storage system configuration). As noted above, the commands may include requests to read or retrieve configuration data (from either the simulator 106 when servicing the request in simulation mode or from the data storage system 120 when servicing the request in non-simulation mode) whereby such data may then be returned to the API code 104 and then the GUI 102. The commands may also include commands to perform a requested service or operation and may result in writing data (e.g., update existing configuration data or create new instances of data) regarding the data storage configuration.

The simulator 106 may use a set of simulated configuration data included in data store 121 such as, for example, in connection with servicing a command without requiring the actual hardware of the data storage system and interaction with the data storage system. For example, it may be that software of the client 110 and/or on the data storage system 120 used in servicing the particular command in non-simulated mode is not available, not implemented and/or otherwise not operational for servicing the request. In this case, the command may be serviced using the simulator 106. In accordance with techniques herein, the GUI 102 may issue requests to the API code 104 to perform all commands and the API code 104 may make a runtime determination as to whether to service the request operating in a simulation mode (e.g., using the simulator 106) or a non-simulation mode (e.g., issuing the request to the data storage system 120).

When servicing a command using non-simulation mode, the client 110 may issue the command request over connection 112 and communicate with a web server 122 of the data storage system 120. For example, the web server 122 may be an Apache/Tomcat web server. To service the command, the web server 122 may communicate with other software components 124 to perform operations on a database or data store 126 including the data storage system configuration information. Additionally, the other software components 124 may include components which use polling or other techniques to gather state and configuration data regarding the current configuration and status of the data storage system 102. For example, the data storage system 102 may include hardware components as described in connection with FIGS. 1 and 2 and additionally include other software which monitors and collects information regarding the data storage system (e.g., changes in the status of particular physical entities change over time, information regarding the addition and removal of physical entities such as storage devices, fans, power supplies and the like) and populates the data store 126 with any required updates for the data storage system configuration data stored therein. When servicing a command using non-simulation mode, the command may be serviced using the actual data storage system configuration data of data store 126.

With reference to FIG. 3, the runtime path or stack for non-simulation mode for issuing a command may be represented by the 102, 104, 112, 124 and 126. The return path may be a reverse traversal of the foregoing path associated with issuing the command. The runtime path or stack for simulation mode for issuing a command may be represented by the 102, 104, and 106. The return path may be a reverse traversal of the foregoing path associated with issuing the command.

Although the simulator and associated functionality are illustrated as being included in the client 110, the simulator and associated functionality may be embodied in one or more other software components on the management system or any other suitable system. It should be noted that although techniques are described herein for use with a data storage system 120, more generally the techniques herein may be used with a server servicing a command request for a client.

Generally, an embodiment may provide an options file 113 that is read in at runtime by the simulator thereby allowing for enabling/disabling use of simulation mode or non-simulation mode without rebuilding other software. Thus, in some embodiments, the data storage management software may be installed, loaded and executing on the management system. At a first point in time, a first set of options may be read in from a first options file whereby the options file does not identify command request 1 (such as issued by a call from the GUI to the code of the API) as having simulation mode disabled. Thus, all instances or requests to perform command request 1 are performed using simulation mode provided that the simulator 106 is capable of simulating command request 1. At a second later point in time, the options file may be modified/updated to indicate that the simulator or simulation mode is disabled for use with any requests to perform command request 1 thereby indicating that any requests for command request 1 are serviced using non-simulation mode. Thus, all instances or requests to perform command request 1 may be performed using non-simulation mode independent of whether the simulator 106 is capable of simulating command request 1. The data storage management software may be again be launched and executed after this second point in time. The data storage management software may read in the updated options file and now service any requests for command request 1 using non-simulation mode.

Generally, command requests issued by the GUI to the API code may have a format of:

Command object type (parameter(s))

where

"Command" may be a command or operation requested for a particular command or operation type (e.g., GET, UPDATE, CREATE, DELETE);

"object type" identifies one of the object types of the object model, and

"parameter(s)" identifies any one or more parameters for the command. It may be that the command has no parameters.

Commands or operations may be generally partitioned into two classifications—GET and SET operations. GET operations may generally refer to commands which request retrieval of information that is returned up the runtime call stack (e.g., read operation where request is to return data, based on the optional parameter(s), to the Command layer). An example may be the Get_list command to obtain a list of information for one or more objects in accordance with the specified object type and parameter(s). SET operations may generally refer to commands which request that information on the server be updated based on data included in the request (e.g., create a new object of a particular type, modify or update an attribute of an existing object of a particular type, delete an existing object of a particular type, and the like). The particular syntax and commands may vary with embodiment. With a SET command, the parameters may include name-value pairs where each pair may represent an object property and a value to be assigned to the property. For example, SET LUN (ID=5, PROP_A=V1) may be a request to set the property "PROP_A" to the value V1 for the LUN object having ID=5. As another example, a command may create a snapshot of a LUN object such as Create_SNAPSHOT LUN (ID=5, . . . ) which may return a handle to the created snapshot. Examples of object types may include different types identifying different hardware and/or software entities in the data storage configuration and its object model. For example, object types may include LUN or logical device, physical device (PD), storage group (SG), RAID group, and the like. Further examples of commands, objects and properties are described in more detail elsewhere herein.

Such command requests as issued from the GUI to code of the API may be further transformed, processed, or mapped in accordance with the particular commands, parameters, and the like, supported for use with other lower software layers in the runtime stack or path.

It should be noted that the general classification of SET commands noted above may be implemented in an embodiment which includes commands for CREATE, UPDATE and DELETE rather than a SET command which may perform any/all such operations of create, update and delete with respect to identified object types and parameters provided. Thus, commands may be characterized as being a request to perform a particular type of operation where the type may be any of GET, CREATE, UPDATE or DELETE. Alternatively, an embodiment may implement functionality associated with CREATE, UPDATE and DELETE operations using a single type referred to as SET.

Command requests may include the following information: Command, object type, and optionally one or more parameters. Based on this, the information in the options 113 may identify a command request by specifying any of the following:

COMMAND TYPE (e.g., alone with object type and parameters)—thereby specifying to disable simulation mode for all command requests including this command type;

COMMAND TYPE, OBJECT TYPE (e.g., without parameters)—thereby specifying to disable simulation mode for all command requests including the combination of command type and object type; or COMMAND TYPE, OBJECT TYPE, one or more parameters—thereby specifying to disable simulation mode for all command requests including the combination of command type, object type, and the one or more parameters.

As a further example, consider the GUI issuing a command request such as using an API call to code of the API to get a list of LUNs currently defined in the data storage system The GUI may need such information to be displayed on a UI. Additionally, for each LUN in the list, the GUI may need only selected LUN object properties such as a PD providing the LUN's physical storage, and only selected PD object properties of the PD. The GUI may issue a command request such as GET LUN ("name", "LUN_ID", PD.ID, PD.CAPACITY) to obtain, for each currently configured LUN, the LUN properties "name" and "LUN_ID" (LUN identifier). Additionally, each LUN may have an associated PD object. For the PD, return the PD's ID (e.g., denoted as PD.ID) and capacity (e.g., denoted as PD.CAPACITY). In this example, the parameters of embedded or associated objects are denoted using the "." notation indicating a reference to another embedded object of type PD. It should be noted that although only a single level of embedded object references are illustrated above, an embodiment may allow a parameter to include multiple embedded object reference levels. As discussed herein, an embedded object represents an association between the embedded object and a second object which includes or contains the embedded object.

In connection with operating in simulation mode for simulating requests and simulating a data storage system configuration, request to write or modify an embedded object may pose a problem depending on that implementation. In one implementation, when a first object is embedded in a second object, the first embedded object may be physically included within the second object. In other words, the content of the embedded object may be included within the second object. For example, PD1 and PD2 may be two objects each belonging to the same pool having object POOL1. In this case, object PD1 and PD2 may each include a duplicated physical copy of the content of object POOL1. A problem may arise when performing a modification operation in simulation mode. For example, if a request is made to modify POOL1, or a property thereof, each physical copy of the POOL1 object included as an embedded object requires the same modification in order to maintain consistency among all physical embedded object copies of POOL1. However, performing such modifications across all embedded object copies is cumbersome and time consuming and introduces the possibility of data inconsistency.

In an embodiment in accordance with techniques herein, rather than store the content of the embedded object, such as the above-mentioned POOL1 object, in duplicate embedded in each of PD1 and PD2 objects, a single copy of the POOL1 object may be stored. Another object, such as PD1 and PD2, which includes POOL1 as an embedded object may include a reference, pointer, identifier, or other suitable linkage, to link to and identify the single instance copy of the POOL1 object. For example, assume that each object of a particular type is identified by a unique identifier where POOL and PD are two different types. The object POOL1 may be identified by the ID "1" to distinguish the POOL1 instance from any other POOL objects. Similarly, PD1 may be identified by ID=1 and PD2 may be identified by ID=2 to uniquely identify each PD object instance. Continuing with the above-mentioned example, PD1 may include as a property field the POOL ID=1 and PD2 may include as a property filed the POOL ID=1. In this manner, any modifications made during simulation to a property of the POOL1 object are made to the single physical copy of the object and automatically reflected in all references or linkages to the POOL1 object whereby such references or linkages are made using the object's identifier (e.g., POOL1's ID=1).

Figure 4:
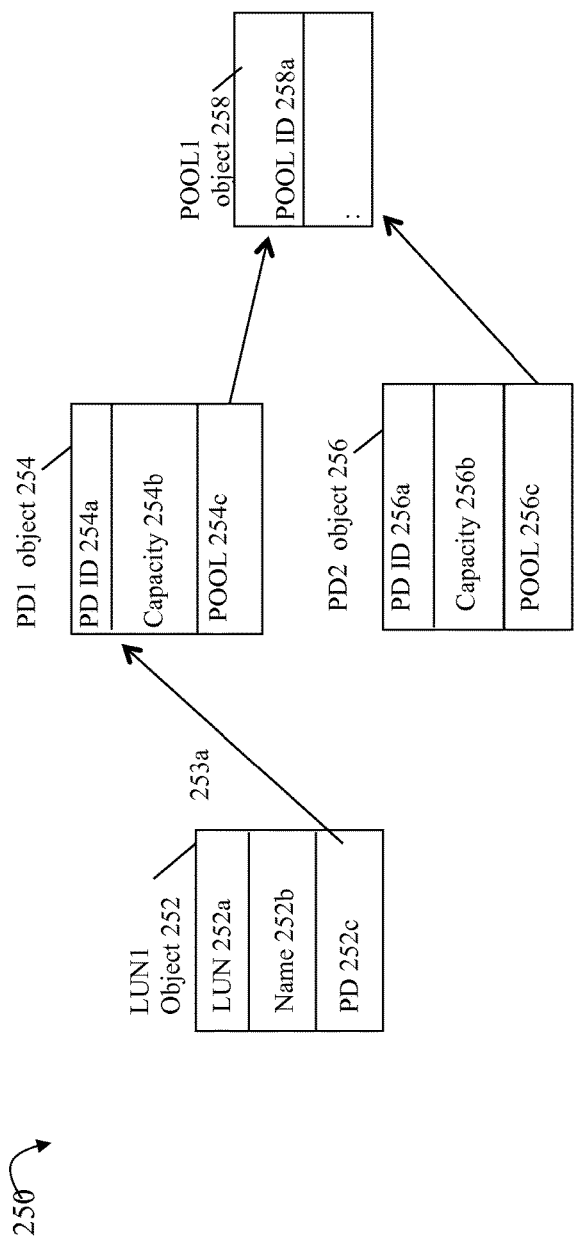
FIGS. 4 and 5 are examples of objects and associated information for object management that may be used in an embodiment in accordance with techniques herein.

Referring to FIG. 4, shown is an example 250 of objects that may be represented using data storage configuration information utilized by the simulator in connection with simulating data storage configuration and servicing requests using simulating in an embodiment in accordance with techniques herein. The example 250 includes objects consistent with description above regarding PD1 254, PD2 256 and POOL1 258 with an additional LUN object, LUN 1 252. The example 250 represents LUN1 252 which has been provisioned with physical storage PD1 254. Each of the PD objects 254 and 256 are included in the same pool, POOL1, represented by object 258. The second PD object PD2 256 is included in POOL 1 with object 258.

LUN object 252 may include the following properties: LUN ID 252*a* (identifying this LUN object uniquely from all other LUN objects in data structures of the data storage configuration information), name 252*b* (which may be a LUN name), PD 252*c* (identifying an object for the PD providing the physical storage for the configured LUN). Each of the PD objects 254, 256 may include the following properties: PD ID (identifying this PD object uniquely from all other PD objects in data structures of the data storage configuration information), capacity (identifying the physical storage capacity of the device represented by this PD object), and POOL (an ID identifying the POOL object representing the POOL including the PD represented by this PD object). Pool object 258 may include the property POOL ID 258*a* (identifying this POOL object uniquely from all other POOL objects in data structures of the data storage configuration information).

In the example 250, the LUN object 252 may be characterized as including two levels of embedded objects and each PD object 254, 256 may be characterized as having a single level of object embedding. When a request is made, for example, display information for an object such as a PD, the information retrieved may include that of its embedded POOL object. In a similar manner, when a request is made, for example, display information for an object such as a LUN, the information retrieved may include that of its first level embedded PD object and also of its second level embedded POOL object.

It should be noted that the example 250 of FIG. 4 shows LUN1 object 252 including a first level embedded PD object 256 thereby indicating that the LUN represented by 252 has storage provisioned on PD1 254. More generally, a LUN may have storage provisioned on one or more PDs.

The example 250 illustrates two levels of embedded objects for LUN1 object 252. As will be appreciated by those skilled in the art, an embodiment may provide for any suitable number of levels of object embedding. An embodiment may set an upper maximum limit regarding the number of levels of embedding that may occur within a single object. For example, an embodiment may allow a maximum level of object embedding of 3, or some other configurable maximum value. The foregoing enforcement of a maximum level of object embedding also provides a means for avoiding infinite recursion that may occur with object embedding although an embodiment may alternatively use other suitable techniques to detect and prevent recursive object embedding. An example of recursive object embedding may be object 1 references object 2 as an embedded object via a property1 of object 1. In turn, object 2 may reference an object3 as an embedded object via a property2 of object 2. Object 3 may further reference object 1 as an embedded object via a property3 of object 3. The reference to object 1 as an embedded object of object 3 via property3 is an example of a recursive embedded object reference. The concept of recursion as applied to embedded objects is similar to the programming concept of recursion known in the art.

With reference back to FIG. 3, when the GUI 102 is starting up, one or more command requests, such as one or more Get commands described herein, may be issued to the API code 104 obtain information used to initially populate a GUI display. The API code 104 may determine at runtime in accordance with the options 113 whether the command request is serviced in a simulated mode whereby the simulator 106 and simulated configuration data are utilized, or whether the command request is serviced in a non-simulation mode whereby the request is serviced by the data storage system 120 using its actual configuration data. The options 113 may be an input to the simulator 106 and the API code 104 may inquire of the simulator 106 regarding whether a particular command request is to be serviced using simulation mode/by the simulator 106. Assume for purposes of illustration that this command is serviced in a simulation mode using the simulator 106. In this case, the data store 121 may include a set of simulated configuration data used to service the request. The set of configuration data used to simulate a data storage system configuration may describe information for one or more LUNs consistent with the representation of FIG. 4 and may also include other information for the LUNs and other objects describing physical and/or logical entities of the simulated data storage system configuration. The simulator 106 may perform processing to simulate servicing the command request as if serviced by the data storage system whereby the simulator returns the requested information for the LUNs described by the simulated data storage system configuration data. If the code of API 104 determines that the command request is not to be simulated, then the command request may be issued to the data storage system for processing in non-simulation mode whereby the current configuration data of the data storage system may include information consistent with the representation of FIG. 4. In non-simulation mode, the command request may be serviced by the data storage system using the data storage system's current configuration data. The data storage system may return to the client the requested information for the LUNs described by the current data storage system configuration data.

An embodiment may generate IDs for different object types using a hashing function. In one embodiment, the object type name, such as POOL, LUN or PD, may be used as the hash key or input to the hash function which is mapped to an array or list including all identifiers of that particular object type. Once the particular array of identifiers is determined, a particular identifier for an object type may then be mapped to a particular object instance of that type, for example, to obtain the object's information.

Figure 5:
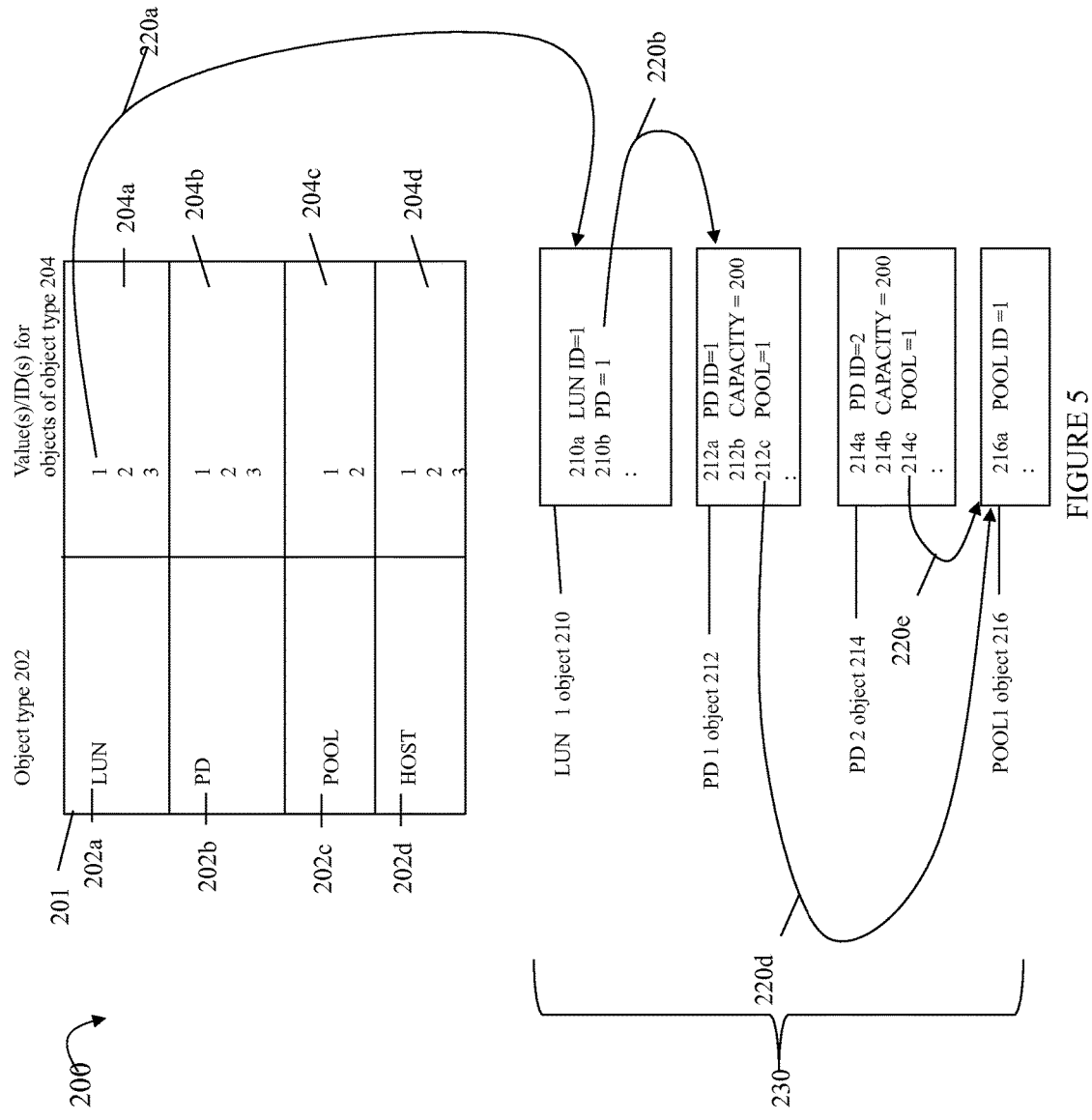

Referring to FIG. 5, shown is an example illustrating data structures of information that may be used in an embodiment in accordance with techniques herein. The example 200 includes a table 201 with object types 202 and values 204. Column 204 includes the IDs for objects of the object types denoted in column 204. Column 202 includes object types LUN 202a, PD 202b, POOL 202c, and HOST 202d. In this example, there are 3 LUNs having identifiers 204a, 3 PDs having identifiers 204b, 2 POOLs having identifier 204c, and 3 hosts have identifiers 204d. In one embodiment the information represented by 204a may be stored in a first array, the information represented by 204b may be stored in a second array, and the information represented by 204c may be stored in a third array. The particular array may be identified using a hash function that maps the object types of 202 to the particular array including IDs for that object type.

For each of the IDs in 204, information for a corresponding object may be included in a corresponding object structure. Some exemplary object structures are provided in 230. It should be noted that 230 includes only a portion of the objects having identifiers in 201 for simplicity of illustration in this example. Element 230 includes LUN 1 object 210 (corresponding to LUN ID=1), PD1 object 212 (corresponding to PD ID=1), PD2 object 212 (corresponding to PD ID=1), and POOL1 object 216 (corresponding to POOL ID=1). It should be noted that each of the objects 210, 212, 214 and 216 may include properties consistent with representation as in FIG. 4. Object 210 includes properties 210a-b, object 212 includes properties 212a-c, object 214 includes properties 214a-c and object 216 includes property 216a. It should be noted that properties 210 b-c represent the PD_LIST 252c of the example 250.

In one embodiment, a function or method, GET ALL OBJECTS (TYPE) may be provided which returns a list of all objects of the same TYPE. For example GET ALL OBJECTS (PD) may return the content or properties for all PD objects. Such information may be returned as a list of all PD objects. The invoked function or method may perform processing which includes providing the TYPE parameter as a key or input parameter to the hash function which identifies the particular array and its location within 201 for the requested TYPE. Once the particular array for the requested type is identified, such as the PD array including the IDs 204b, the invoked method or function may then traverse the list of PD object identifiers to retrieve the object content for each PD object and return the information for all such objects to the caller. Each PD ID in the list 204b may be mapped to the location of the object information for the particular PD whereby such information is retrieved. It should be noted that in this example, each PD object itself includes a further embedded POOL object. In this manner, the invoked code may further obtain the object information of each embedded pool object using the POOL id of each PD object. The object information for each embedded POOL object may be retrieved and incorporated into each PD object's information returned to the caller.

It should be noted that the foregoing illustrates a single level of object embedding. However, as will be appreciated by those skilled in the art.

As noted elsewhere herein, an embodiment may also include another method or function GET TYPE (ID) that returns a particular object instance denoted by ID where the object is of the object type identified by TYPE. For example, GET PD (1) may return the object for the PD having the PD ID=1. The invoked function or method may perform processing which includes providing the TYPE parameter as a key or input parameter to the hash function which identifies the particular array and its location within 201 for the requested TYPE. Once the particular array for the requested type is identified, such as the PD array including the IDs 204b, the invoked method or function may then traverse the list of PD object identifiers to verify that the ID provided as a parameter matches one in the list 204b. Then, using the ID provided as the parameter, processing may be performed to map the ID to the location of the object information and retrieve the object content for particular PD object and return the information to the caller. As noted above, in this example, each PD object itself includes a further embedded POOL object. In this manner, the invoked code may further obtain the object information of the embedded pool object using the POOL ID 212c. The object information for the embedded POOL object may be retrieved and incorporated into each PD object's information returned to the caller.

As a further illustration, assume that a call is made to obtain all object information for LUN1 such as by issuing GET LUN (1). The invoked code may identify 202a as the array including the LUN identifiers 204b. The ID=1 provided as the parameter matches the first ID of the array which is then mapped 220a to the LUN 1 object instance 210. Processing may retrieve the contents of 210 and also of the embedded PD object denoted by 210b. The PD=1 of 210b may be mapped 220b to PD1 object 212 to retrieve information of 212 in generating the LUN 1 object information returned to the caller. In retrieving the contents of 212, processing may determine that 212c is an identifier, POOL ID=1, of another embedded POOL object whereby the ID of property 212c is mapped 220d to object 216, and the contents of 216 may be retrieved for incorporation into an assembled structure of information returned to the caller.

Figure 6:
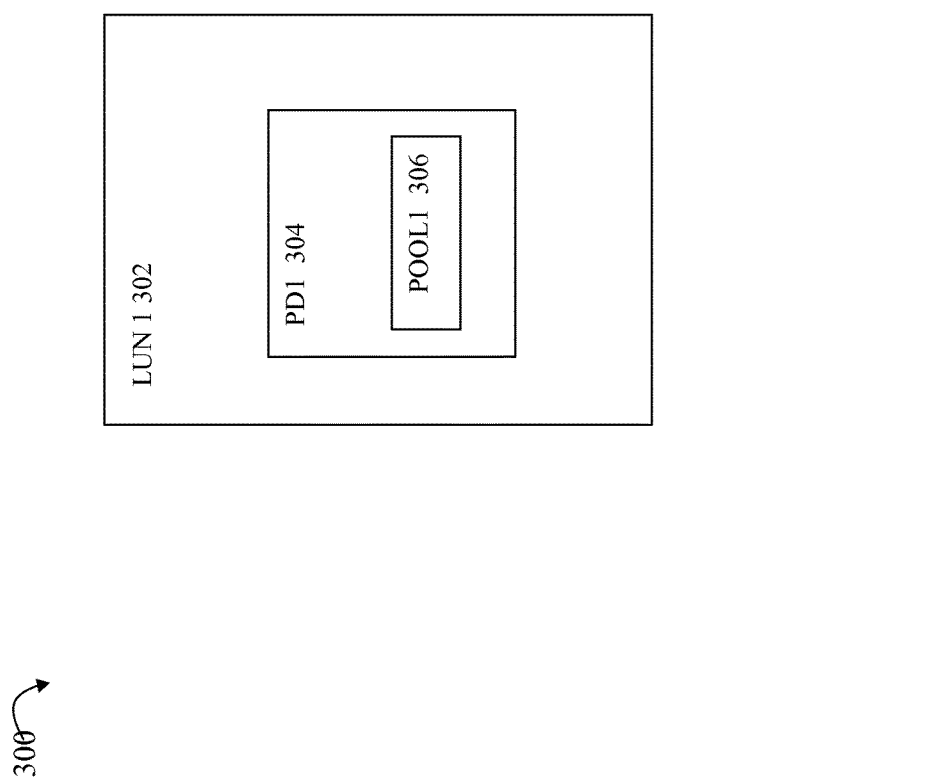
FIG. 6 is an example of an assembled object including embedded objects that may be returned in response to simulating servicing of a request using data storage system configuration information of a simulated data storage system configuration in an embodiment in accordance with techniques herein.

Referring to FIG. 6, shown is an example of an assembled LUN object, such as for LUN1 object 210, in an embodiment in accordance with techniques herein. As described above and elsewhere herein, the information of the various embedded objects may be obtained through references and linkages which may then be assembled into a final structure of information returned to the caller. The example 300 includes 302 representing information of the LUN1 object 210. Element 304 may represent information of the first level embedded PD1 object 212. Within each of the objects PD1 212 and PD2 214 is embedded POOL object 216. Element 306 represents the instance of POOL object 216 embedded within PD1 object 212. The example 300 represents the information that may be returned to a caller in response to issuing the get object (LUN, 1) call as mentioned above.

As just described, a single instance of each object in the data storage configuration information used by the simulator may be stored for use in an embodiment in accordance with techniques herein. Associated or related objects (e.g., embedded objects) may be obtained through the use of references, such as the various object type IDs, described above. In this manner, all read or get operations uses a single copy of an object even though that object, such as POOL 1 object 216, may be embedded within multiple objects, such as objects PD1 212 and PD2 214.

As mentioned above, in a manner similar to that as described for get or read operations, an embodiment may provide a defined interface to invoke one or more methods or routines which put or write an object, or one or more properties thereof. The put or write operations may include updating an existing object, and properties thereof, as well as creating or writing information for a new object. With reference to the example 200, a put operation to update a property of an existing object may be performed using a defined interface such as PUT TYPE (ID, object_information) where TYPE and ID are similar to that as described above in connection with GET requests. The parameter object information may identify the object information or properties to be written to the object instance denoted by ID having the object type of TYPE. In such an embodiment, a complete set of object information (e.g., all properties) may be specified even if only a single property of the object is updated with a new or different value (e.g., the remaining properties written may not be new or different in comparison to a current set of properties prior to issuing the put operation). The foregoing put object may be invoked to update an existing object or write a new object. Alternatively, as also noted elsewhere herein, an embodiment may provide separate defined interfaces for updates to existing objects and for writing or creating a new object.

An embodiment may also provide a finer granularity of control to perform put operations with a defined interface, such as: PUT TYPE (ID, Property 1=value1, Property 2=value2 . . . ), to update one or more properties of an object. TYPE may identify the object type and ID may identify the particular object instance being updated. The properties and values to be assigned thereto may be identified in the list "Property 1=value, Property 2=value . . . " of property-value pairs (e.g., property N is assigned value N). If a particular property in the list belong to an embedded object, suitable notation may be used to denote the embedded object and property being updated. For example, with reference to the example 200, assume a call is made to update the POOL ID of PD1 where PD1 is a first level embedded object of LUN1 and POOL1 is a second level embedded object of LUN1. The call to perform the update may be PUT LUN (1, PD1.POOL ID=2) whereby PD1 is now identified as belonging to the pool represented by POOL OBJECT with ID=2.

Syntax used to reference an object property and the nesting of embedded objects within one another may be represented using syntax such as in the foregoing example as well as any suitable syntax. For example, as used herein, an object property PROP1 of OBJ1 may be denoted as OBJ1.PROP1. Further, assume OBJ1 has an embedded object OBJ2 identified by PROP1 (e.g., PROP1 is a reference or ID of OBJ2), and OBJ2 includes a second object property PROP2, a reference to PROP2 through the embedded object OBJ2 may be denoted as OBJ1. PROP1. PROP2 whereby multiple levels are denoted through a nested list of object properties in accordance with the particular objects and embedded objects.

In a similar manner, an embodiment may also provide a finer granularity of control to perform GET operations with a defined interface, such as: GET TYPE (ID, Property 1, Property 2, . . . ), to read one or more properties of an object. The properties read and returned by the call are identified in the list "Property 1 Property 2 . . . ".

Based on the foregoing, an embodiment may perform reads (e.g., gets) and puts (e.g., writes) using a single physical copy of an object. Thus, when an update is performed to the single copy of the object's data, all references to the object retrieve the updated information in the single copy.

In an embodiment, an operation may be performed to delete an object, such as to delete one of the objects in 230, or more generally, delete an object having a corresponding ID in the table 201. Such an operation may be performed using a defined interface such as DELETE TYPE (ID) whereby TYPE and ID are may be described above in connection with the get and put calls. In this case, the invoked code may delete the object instance and accordingly update the information in the table 201 to no longer include the particular ID for the deleted object. Additionally, the newly deleted object may be referenced as an embedded object within a second object. In such a case, it may be that the second object still includes a reference to the deleted object. For example, with reference to the example 200, object POOL 1 216 may be deleted and each of PD1 212 and PD 2 214 may still include a reference to POOL 1 216 via the properties 212c and 214c which include the POOL ID=1. In one embodiment, when resolving an embedded object reference using an object ID included as a property of another object, processing performed to look up the object ID in the table 201 may result in the ID not being found in the table 201, such as would be the case if there is an attempt to retrieve POOL1 object information using 212c or 214c after deleting object 216. In this case, an embodiment may choose to simply ignore an embedded object reference to an object which cannot be located in the table 201. Thus, for any such reference to an embedded object, whereby the reference is invalid and does not identify an existing object instance, it is presumed that the embedded object instance has been previously deleted. In such an embodiment, processing may therefore not be performed to remove all references to a deleted object whereby the deleted object is embedded within another object via one of the references.

In one embodiment, the properties of an object, such as properties of objects 210, 212, 214 and 216 and other for objects having IDs in tables 201, may be represented using name-value pairs. Objects 210, 212, 214 and 216 include object properties each expressed using name-value pairs whereby the "name" (identifying the particular object property) is assigned a "value". For example with reference to 210a, the "name" of "LUN ID" may denote an object property and the value "1" indicates the property value assigned to property LUN ID for that particular object LUN 1 210.

Since all object properties in such an embodiment may be expressed using name-value pairs, a first object property value that is a reference to an embedded object, such as 214c, and also a second property value, such as 214b which does not identify an embedded object, may both be represented using a name-value pair. In such an embodiment, a problem that may arise is how to distinguish between such kinds of properties to identify when an object property is actually a reference to an embedded object (e.g., how to determine whether a value of a property is a reference or identifier of another embedded object), and when an object property is not a reference to an embedded object.

In one embodiment, object model definitions may be used which describe the layout or format of each of the object types and, for each object property, may identify whether the particular property, expressed as a name-value pair in the object information, represents a reference to another object that is an embedded object.

Described in following paragraphs are techniques that may be used in an embodiment to determine whether a property and its associated value for an object denote a reference to an embedded object. Such techniques may further utilize additional information such as included in object model definition files. Object model definitions files and their use in connection with techniques herein in an exemplary embodiment are described in more detail in following paragraphs.

In one embodiment, there may be a file in the data store 121 of FIG. 3 for each object type. In one embodiment, such files may be written using JSON (JavaScript Object Notation)). As known in the art, JSON is a text-based open standard designed for human readable data interchange based on the JavaScript scripting language for representing objects. JSON may be used an alternative, for example, to XML. Particularities, such as use of JSON, may be implementation dependent and vary with embodiment. Generally, JSON or any suitable technology and form may be used to represent the object information in such files including object information for the object types.

Each JSON file may include a list of all defined and created objects in the data storage configuration information used for simulating the data storage system configuration. For example, there may be a JSON file for each of the following objects types: LUN, PD, POOL, HOST, as well as other objects types that may be used in an embodiment. In each JSON file, data for all existing objects (e.g., all properties for all objects) of the particular type may be included. For example, the JSON LUN file may include properties for all LUN objects defined in the data storage configuration information used by the simulator. To further illustrate, with reference back to the example 200, the various JSON files may include object information for all instances and types in the table 201. The JSON LUN file may include property values for 3 LUN objects identified by 204a. The JSON PD file may include property values for 3 PD objects identified by 204b. The JSON POOL file may include property values for 2 POOL objects identified by 204c. The JSON HOST file may include property values for 3 HOST objects identified by 204d. The properties and associated values for the objects may be in the form of name-value pairs as described elsewhere herein. The foregoing is illustrated generally in FIG. 7.

Figure 7:
FIGS. 7, 8 and 9 are examples illustrating different files of information for object types that may be used in an embodiment in accordance with techniques herein.

Referring to FIG. 7, shown is an example illustrating JSON files that may be used in an embodiment in accordance with techniques herein. The example 700 includes JSON files 710, 720, 730 and 740, respectively, for each of the different embedded object types LUN, PD, POOL and HOST. Each of 710a-n may represent an instance of information for a single LUN object (such as LUN1 object 210). Each of 720a-n may represent an instance of information for a single PD object (such as PD objects 212, 214). Each of 730a-n may represent an instance of information for a single POOL object (such as POOL object 216). Each of 740a-n may represent an instance of information for a single HOST object (such as identified by a HOST ID in 204d). The files of the example 700 may be stored in the data store 121 and may be read in by the simulator 106 in connection with simulating the data storage system configuration and servicing operations with respect to the simulated data storage system configuration.

In one embodiment, each of the JSON files 710, 720, 730 and 740 may have a file name based on the particular embedded object type whose instances are defined in the file. For example, JSON file 710 may be named in accordance with a naming convention which includes the string "LUN" so that the particular type of embedded objects defined by the file 710 may be identified by file name itself.

Element 210 represents information that may be included in 710a for the object 210 as in FIG. 5. Element 212 represents information that may be included in 720a for the object 212 as in FIG. 5. Element 214 represents information that may be included in 720b for the object 214 as in FIG. 5. Element 216 represents information that may be included in 730a for the object 216 as in FIG. 5. As noted above, such information may be expressed as name-values pairs as illustrated.

Figure 8:
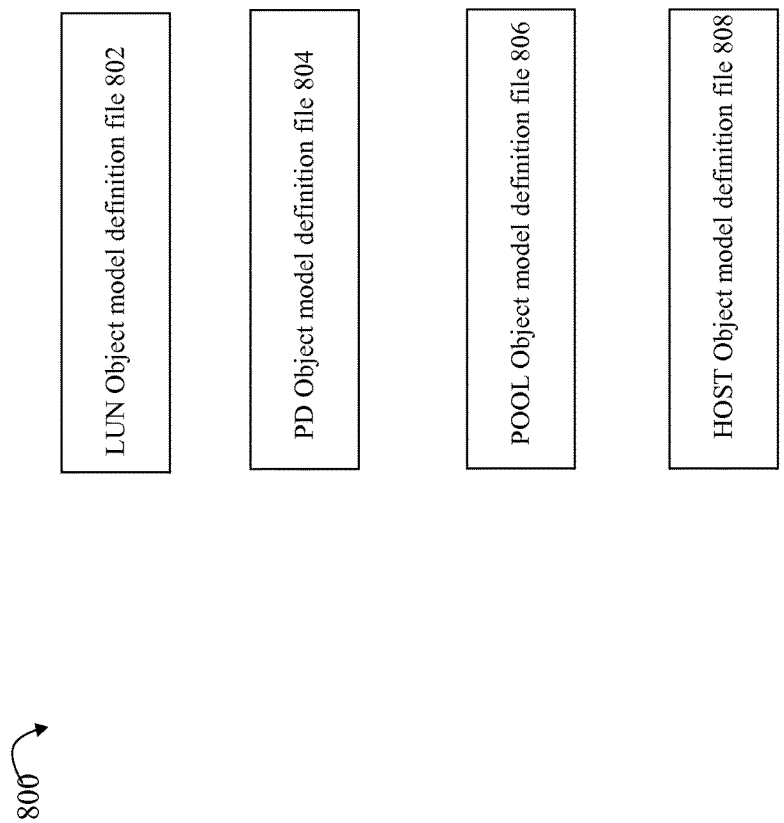

Referring to FIG. 8, shown is an example of object model definitions that may be used in an embodiment in accordance with techniques herein. The example 800 includes an object model definition file for each object type that may exist in the data storage configuration information being used in connection with a simulation. For example, there may be an object model definition file for each object type including those identified in table 201. In one embodiment, the object model definitions may be written in JavaScript whereby the information therein may specify name-value pairs as described in more detail below.

The example 800 includes object model definition files 802, 804, 806 and 808, describing properties, respectively, of object types LUN, PD, POOL and HOST. The mapping between an object type and the associated object model definition file may be performed using any suitable technique. For example, in one embodiment, the mapping between object type and object model definition file for that object type may be accomplished using file naming conventions in a manner similar to that as described elsewhere herein for mapping a JSON file (or more generally file of object definitions providing property values for object instances) to a particular object type. As another way, the particular mapping of object type to object model definition file may be encoded within executing code, such as of the API or GUI. As yet another alternative, the foregoing mapping information may be input from an external source such as a file.

Figure 9:
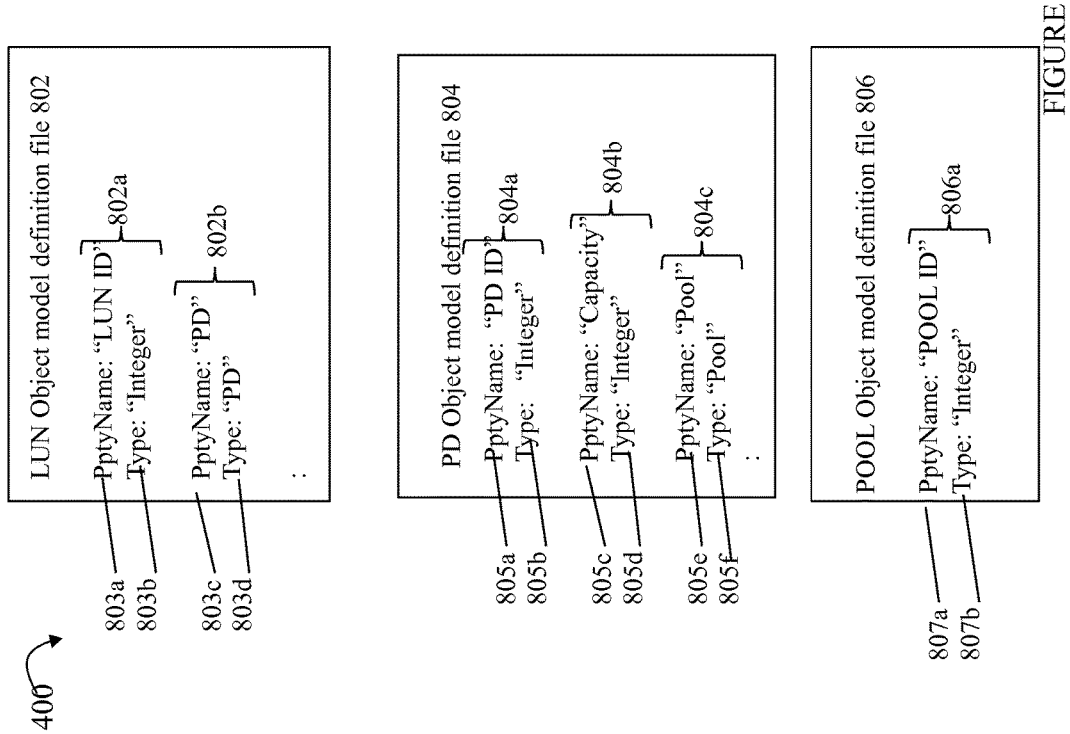

Referring to FIG. 9, shown is an example 400 providing additional details regarding information that may be included in the object model files in an embodiment in accordance with techniques herein. The example 400 provides additional detail regarding object model definition files 802, 804 and 806 of FIG. 8. Additional detail regarding 808 is omitted for simplicity of illustration. The LUN object model definition file 802 may include a set of information for each different property of the LUN object type, such as for each different property in the object 210 of FIG. 5.

Element 802a represent information in file 802 for the property 210a LUN ID. Element 802b may represent information property 210b, the first PD (PD=1). Each set of information 802a-802b may be expressed using name-value pairs. Each set of information 802a-b may identify a property of the object (as denoted by "Ppty (Property) Name") and identify a type for the property (as denoted by "Type") of the object type LUN. For example, element 802a indicates that the property name LUN ID803a is of type integer 803b, and element 802b indicate that the property name PD 803c is of type PD 803d. The Type field 803b, 803d included in each of 802a-b may denote any one of various defined types in an embodiment including one or more primitive or basic types (e.g., integer, string, Boolean), and one or more complex object types, including those object types of embedded objects (e.g., types in table 201).

It should be noted that the particular set of information 802a-b corresponding to a particular object property may be identified using any suitable technique. In connection with the example 400, the particular set of information 802a-b corresponding to a particular object property may be determined based on a match between the Ppty name in each of 802a-b in the object model definition file 802 and the named property field in the object instance of the LUN JSON file 710.

The PD object model definition file 804 may include a set of information for each property of the PD object type, such as for each property in the objects 212, 214 of FIG. 5. For example, with reference to PD1 object 212, element 804a represents information in file 804 for the property 212a PD ID. Element 804b represents information for property 212b, capacity. Element 804c represents information for property 212c, the POOL with POOL ID=1. Each set of information 804a-804c may be expressed using name-value pairs. Each set of information 804a-c may identify a property (as denoted by "Ppty (Property) Name") and identify a type for the property (as denoted by "Type") of the object type PD.

For example, element 804a indicates that the property name PD ID 805a is of type integer 805b. Element 804b indicates that the property name capacity 805c is of type integer 805d. Element 804c indicates that the property name pool 805e is of type Pool 805f. The Type field 805db, d, f included in each of 804a-c may denote any one of various defined types in an embodiment including one or more primitive or basic types (e.g., integer, string, Boolean), and one or more complex object types, including those object types of embedded objects (e.g., types in table 201).

It should be noted that the particular set of information 804a-c corresponding to a particular object attribute may be identified using any suitable technique. In connection with the example 400, the particular set of information 804a-c corresponding to a particular object property may be determined based on a match between the Ppty name in each of 804a-c in the object model definition file 804 and the named property field in the object instance of the PD JSON file 720.

The POOL object model definition file 806 may include a set of information for each property of the Pool object type, such as for each property in the object 216 of FIG. 5. For example, element 806a represents information in file 806 for the property 212a POOL ID. The set of information 806a may be expressed using name-value pairs. The set of information 806a may identify a property (as denoted by "Ppty (Property) Name") and identify a type for the property (as denoted by "Type") of the object type POOL.

For example, element 806a indicates that the property name POOL ID 807a is of type integer 807b. The Type field 807b included in 806a may denote any one of various defined types in an embodiment including one or more primitive or basic types (e.g., integer, string, Boolean), and one or more complex object types, including those object types of embedded objects (e.g., types in table 201).

It should be noted that the particular set of information 806a corresponding to a particular object attribute may be identified using any suitable technique. In connection with the example 400, the particular set of information 806a corresponding to a particular object property may be determined based on a match between the Ppty name in 806a in the object model definition file 806 and the named property field in the object instance of the POOL JSON file 730. Other object model definition files may identify a type for each object property in a manner similar to that as described above for files 802, 804 and 806.

With reference back to FIG. 7 as described herein, processing may be performed for a set of object information (e.g., such as a set of information represented by 210, 212, 214 or 216) providing values for the particular object properties of a particular object type. Such object information may be retrieved in connection with get/read and put operations performed on objects of the data storage configuration information used in connection with simulation. For example, consider performing a get and/or a put operation which includes reading and/or writing object information from a JSON file. For example, for a read/get operation, processing includes assembling a set of complete information to be returned to a caller where the complete information includes object information for all embedded objects. This processing may include traversing the names of the object properties expressed using the name-value pairs for an object as included in the JSON file. For example with reference to element 210 of FIG. 7, each of the names "LUN ID" (in 210a) and "PD" (in 210b) are traversed. Processing may be performed to determine, for each such name, whether the name matches one of the predefined number of object types, such as from table 201. If there is a match between a property name in the JSON file (object information providing values for object properties) and an object type, a corresponding one of the object model definition files is then determined. For example, the name "PD" in the second line 210b of 210 matches an object type of "PD" serving as a trigger to determine the object model definition file for object type LUN. The match between an object property of the JSON file and one of the object types indicates that additional information is needed to determine whether the particular object property denotes a reference to an embedded object, or not. In this particular embodiment, the object model definition file mapped to the particular object type (e.g., LUN) which includes the matching object property (e.g. PD) includes such additional information. In this example, the LUN object model definition file 802 may be determined as the object model definition file mapped to the object type LUN, which includes the object property "PD" 210b.

With reference again to FIG. 9, the LUN object model definition file 802 may be searched for a set of information having a PptyName (identifying an object property) that matches the object property "PD" (the object property determined to match one of the object types). The information in 802 is used to determine whether the particular object property "PD" is a reference to an embedded object, or not. In this example, it is determined that the object property "PD" of 210b matches the Ppty Name 803c in the set of information in 802b. The associated Type 803d included in 802b is read and identifies the actual real type of the object property "PD" as "PD". In this case, it is known that PD is an object type as identified by 803b of 802b and it is determined that the corresponding object property 210b identifies an embedded object of object type PD having an ID (PD ID)=1. It should be noted that use of the object model definition files to determine whether the object property (in the name value pair of object information in the JSON file) matching an object type denotes a reference to an embedded object allows for the possibility that an object property having the same name as an object type may not identify a reference to an embedded object if the type information in the object model definition file indicates otherwise. For example, it may be that the object type of LUN includes a property with the name PD which may actually be an integer, string or Boolean. If so, such true type information may be indicated in 803d of 802b.

It should be noted that as an alternative to using a trigger condition that the object property (in the name value pair of object information in the JSON file) match an object type, an embodiment may generally use any suitable technique. For example, an embodiment may not require that an object property appearing in the JSON file have a name that matches an object type. Rather, any name may be used to name the object property of a particular object type. In such an alternative embodiment, the object model definition file for the object type may be consulted for each object property to determine the type information (e.g., 803b, 803d, 805b, 805d, 805f, 806b).

Referring to FIGS. 10-14, shown are flowcharts of processing steps that may be performed in an embodiment in accordance with techniques herein. FIG. 10-14 summarize processing as described elsewhere herein.

Figure 10:
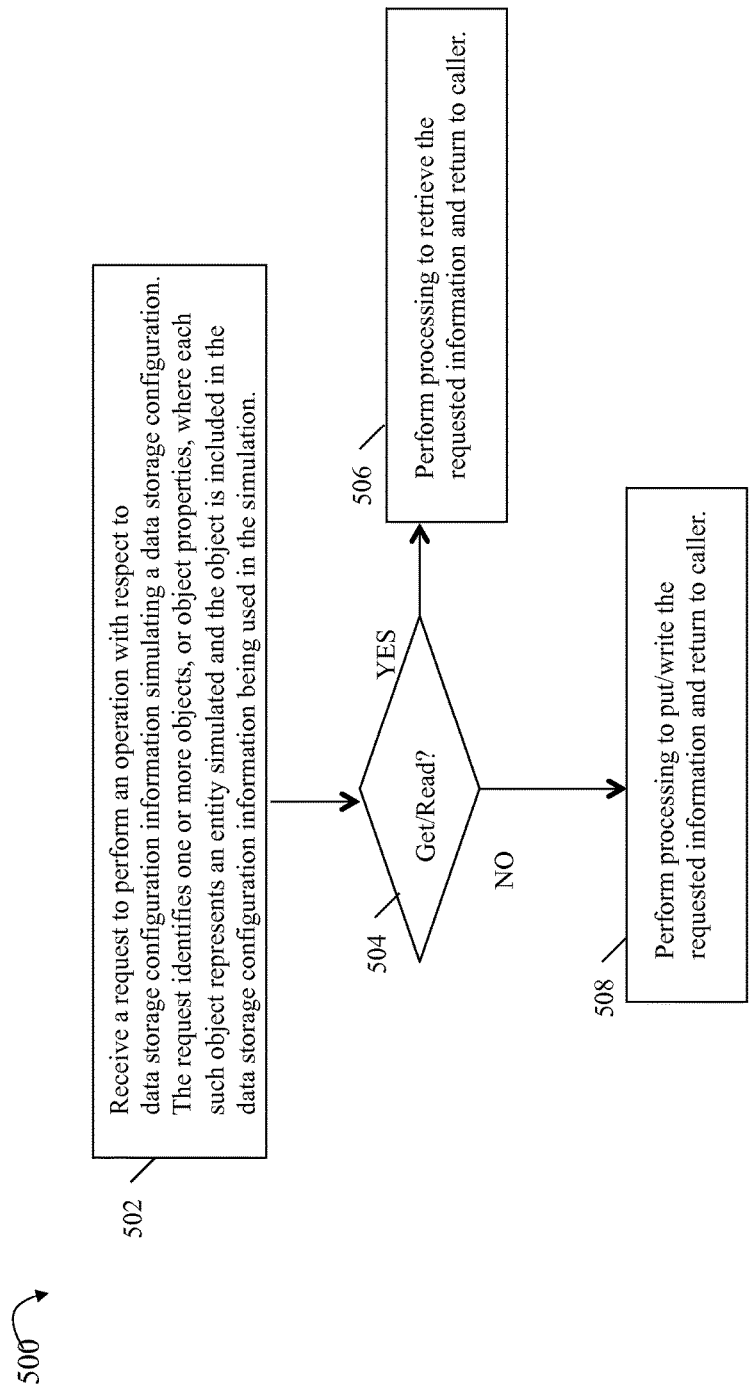
FIGS. 10-14 are flowcharts of processing steps that may be performed in an embodiment in accordance with techniques herein.

Referring to FIG. 10, shown is a first flowchart 500 of processing steps that may be performed in an embodiment in accordance with techniques herein. At step 502, a request may be received to perform an operation with respect to data storage configuration information simulating a data storage configuration. With reference to FIG. 3, the request may be received, for example, by code of the API 104 whereby the request may be issued by the GUI 102. The request may be sent responsive to an event occurring in the GUI, such as in response to a user selection of a UI element to read/display data storage configuration information or write/update data storage configuration information. Consistent with description elsewhere herein, the data storage configuration information may be currently in use by the simulator 106 for simulating a configuration of a data storage system. For a GUI of a data storage management application, a user may issue such a request as received in connection with step 502 to display information regarding the currently simulated data storage system configuration using the storage configuration information of data store 121. The request received in step 502 may also be a request to update or modify the currently simulated data storage system configuration whereby the request is serviced by simulating the modification to the current data storage configuration by modifying the data storage configuration of the data store 121 used for the simulation. The request identifies one or more objects, or object properties, where each such object represents an entity simulated and the object is included in the data storage configuration information being used in the simulation. At step 504, a determination is made as to whether the request is to perform a get or read with respect to the data storage configuration information. If step 504 evaluates to yes, control proceeds to step 506 to perform processing to retrieve the requested information and return to the caller. Thus, step 506 is performed using the simulator 106 to read the requested configuration information from the data store 121. If step 504 evaluates to no thereby indicating the request is to update or modify the current data storage configuration, control proceeds to step 508. In step 508, processing is performed to put/write the requested information thereby simulating the update or modification to the currently simulated data storage system configuration. Thus, step 508 is performed using the simulator 106 to update the information in the data store 121.

Figure 11:
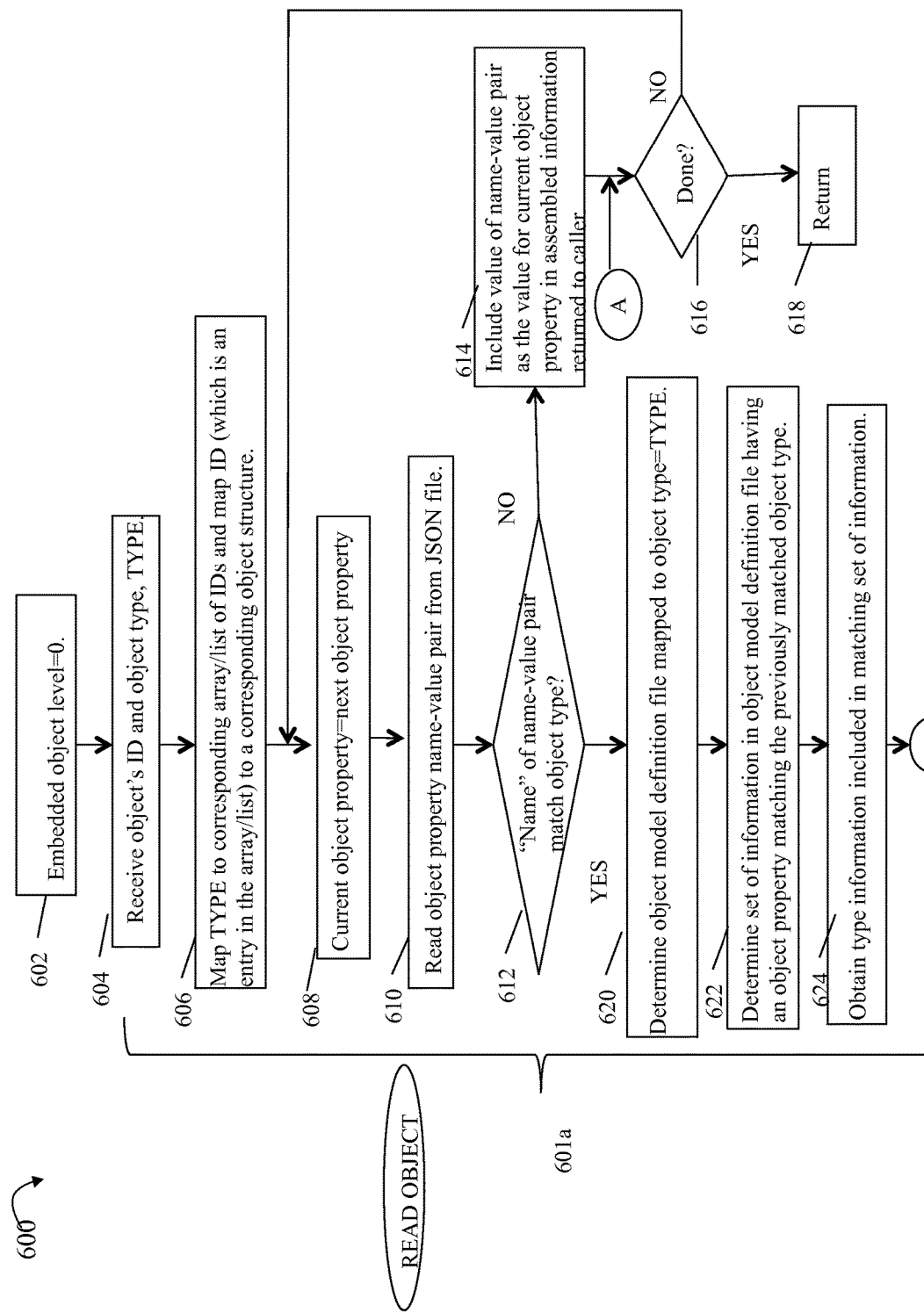
Figure 12:
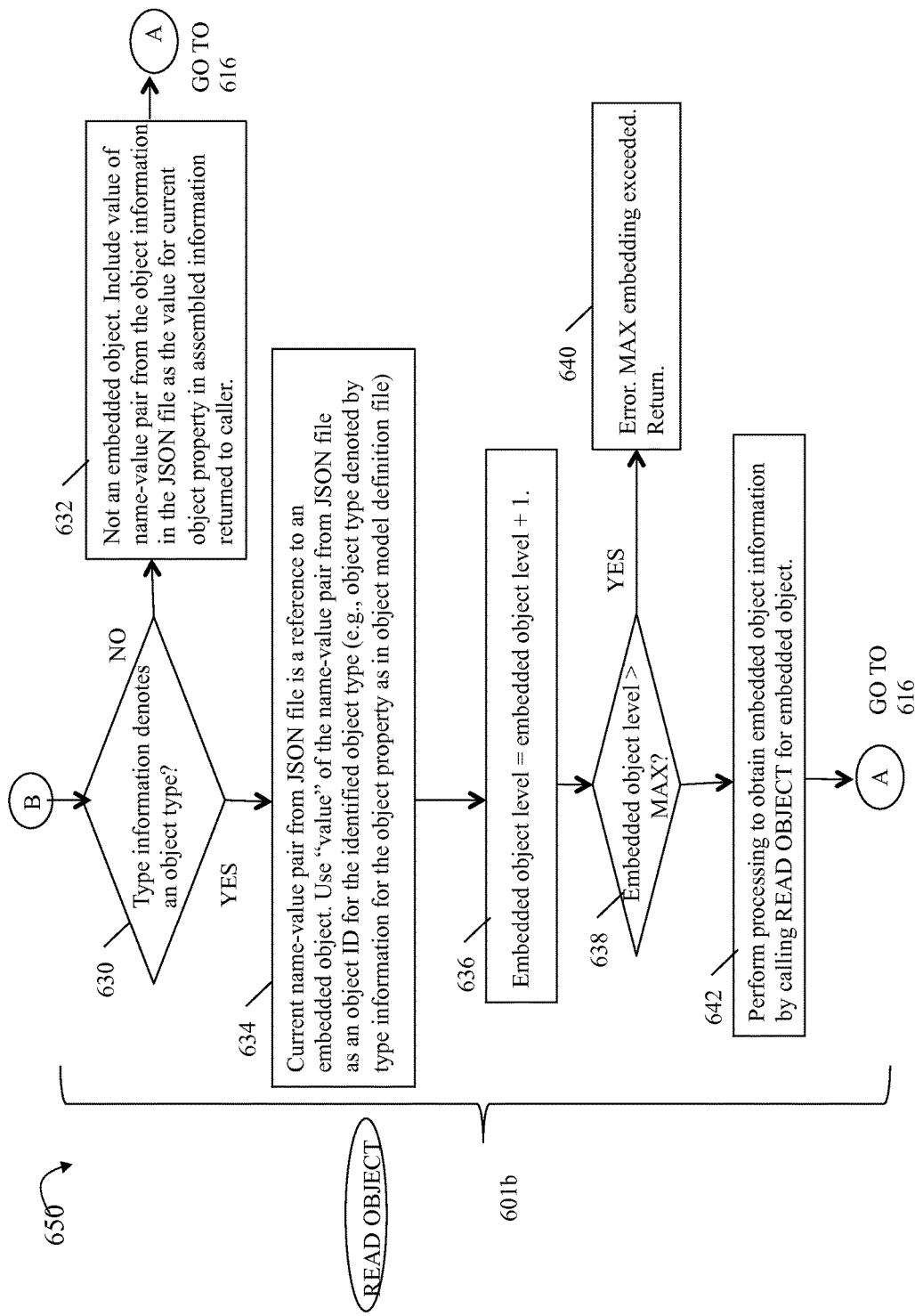

Referring to FIGS. 11-12, shown are flowcharts of processing steps that may be performed in an embodiment in connection with processing of step 506 to read an object's information from the data storage configuration information used to simulate the data storage system configuration whereby such object information may be returned to the caller. It should be noted that flowcharts 600, 650 illustrate processing steps with respect to retrieving all defined object properties and associated property values of an object identified by the request received in step 502. It will be appreciated by those skilled in the art that similar processing may be performed to selectively retrieve and return to the caller one or more particular properties requested rather than such information for an entire object.

At step 602, embedded object level is initialized to zero (0). Embedded object level may represent a current embedded object depth. In following processing, a specified MAX embedded object level may be enforced to avoid infinite recursion with respect to embedded objects, or more generally, to avoid exceeding an undesired maximum depth. It should be noted that the processing to possibly reaching the MAX may be enforced since the data storage configuration data used in the simulation may have been generated using any tool or other means which may have allowed for such data to contain an infinite or an unwanted level of object embedding.

In connection with following description, steps 606-642 of FIGS. 11-12 are included in READ OBJECT processing 601a-b. READ OBJECT may represent processing performed by a body of code or instructions executed whereby the body of code may be included in a function, routine, method and the like. In the processing, a recursive flow description is provided to describe one way in which embedded object processing may be performed. However, other variations will be appreciated by those skilled in the art. For example, processing may also be performed in an iterative manner using control loops.

At step 604, the object's ID and TYPE are received. At step 606, the TYPE may be mapped to a corresponding one of the arrays/lists of object type IDs (e.g., one of the arrays or lists as in 201). Subsequently, the ID which is included in the selected array or list may be mapped to a corresponding object structure such as one including object information in a JSON file. Step 604 may include determining the corresponding JSON file for the object TYPE and reading the object's information for processing. At step 608, the next object property is determined as the current object property. At step 610, the current object property's name-value pair may be read from the JSON file. At step 612, a determination is made as to whether the "Name" of the name-value pair matches an object type. If step 612 evaluates to no, control proceeds to step 614 to include the name-value pair as the current object property and associated value in the assembled object information returned to the caller. At step 616, a determination is made as to whether all object properties of the current object have been processed. If step 616 evaluates to no, control proceeds to step 608, and otherwise, control proceeds to step 618 to return from read object processing.

If step 612 evaluates to yes, control proceeds to step 620 to determine the object model definition file mapped to the object type=TYPE as received in step 604. At step 622, a set of information (e.g., 802a) from the object model definition file is determined which includes an object property (e.g., 803a) matching the previously matched object TYPE (e.g., object type matched in step 612). At step 624, the type information (e.g., 803b) for the matched object type is obtained from the matching set of information. At step 630, a determination is made as to whether the type information read from the object model definition file in step 624 denotes an object type for an embedded object. If step 630 evaluates to no, control proceeds to step 632 whereby it is determined that the current object property is not a reference to an embedded object. Step 632 includes performing processing to include the current name-value pair (e.g., as read in step 610 from the JSON file) as the current object property and associated value in the assembled information returned to the caller (e.g., sender of the request). Control then proceeds to step 616.

If step 630 evaluates to yes, control proceeds to step 634 whereby it is determined that the current object property having the current name-value pair is a reference to an embedded object. The "value" of the name-value pair is used as an object ID for the identified object type (e.g., object type denoted by type information for the object property as in object model definition file). At step 636, the embedded object level is incremented by 1. At step 638, a determination is made as to whether the current embedded object level exceeds the MAX allowable embedding level. If step 638 evaluates to yes, control proceeds to step 640 to return an error. It step 638 evaluates to no, control proceeds to step 642 to perform processing to obtain the embedded object information by performing a recursive call to READ object for the embedded object as referenced by the current object property. Step 642 includes recursively invoking the READ OBJECT processing as represented by 601a and 601b to perform such processing for the embedded object. From step 642, control proceeds to step 616.

Figure 13:
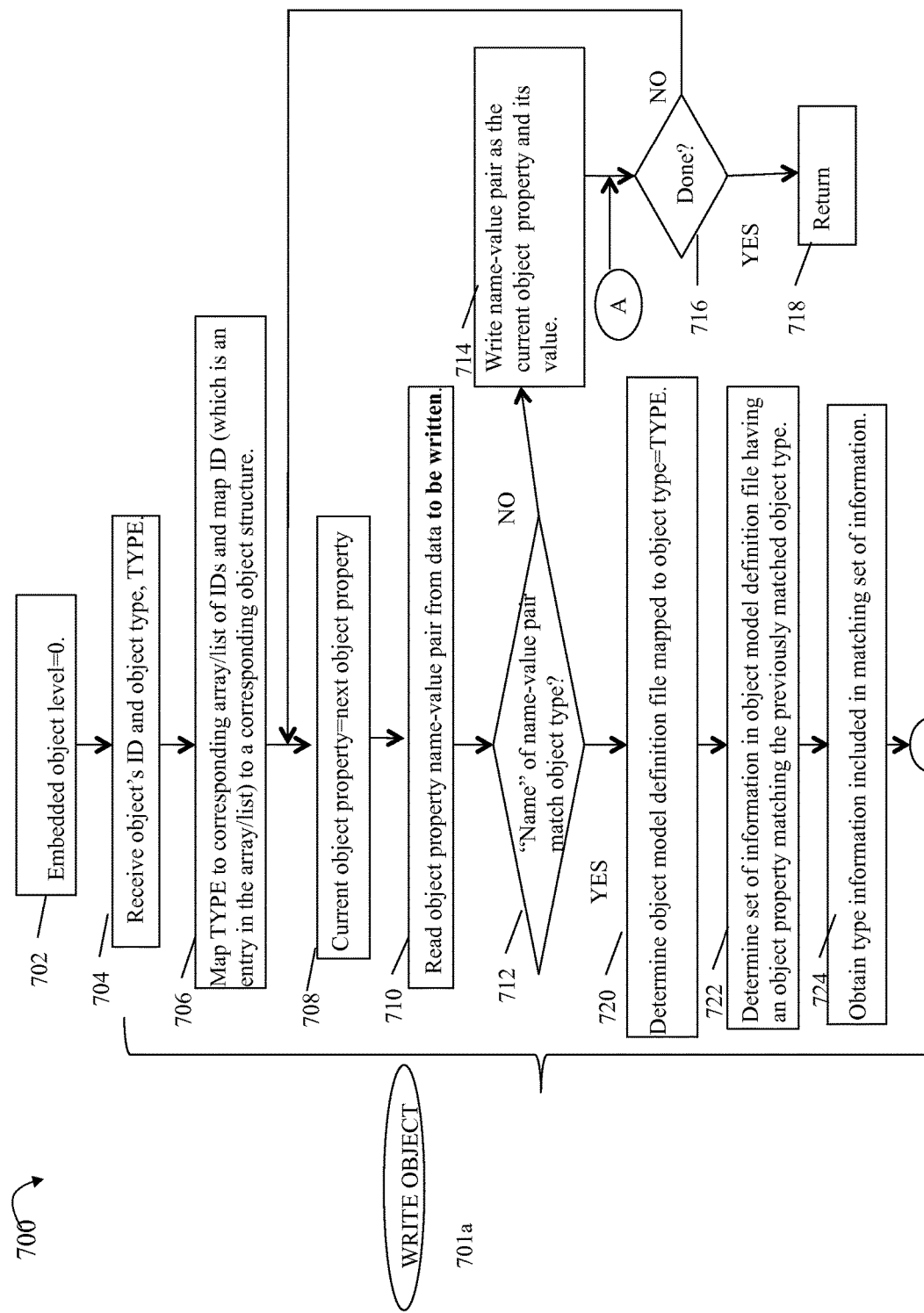
Figure 14:
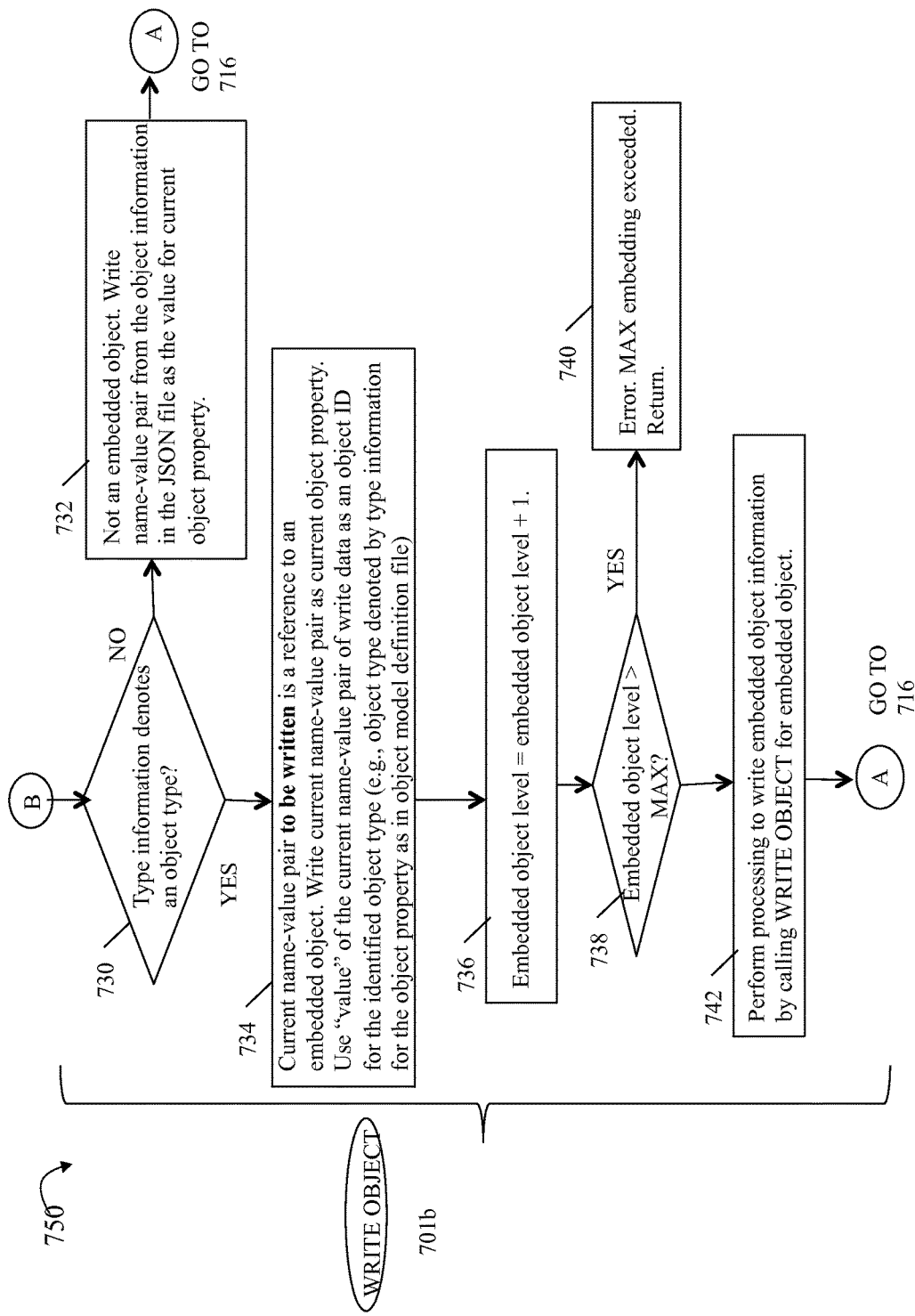

Referring to FIGS. 13-14, shown are flowcharts of processing steps that may be performed in an embodiment in connection with processing of step 508 to write an object's information to the data storage configuration information used to simulate the data storage system configuration whereby such object information may be returned to the caller. It should be noted that flowcharts 700, 750 illustrate processing steps with respect to writing a complete object including all defined object properties and associated property values of an object identified by the request received in step 602. Such writing includes also writing any embedded objects. It will be appreciated by those skilled in the art that similar processing may be performed to selectively write one or more particular properties requested rather than such information for an entire object and its embedded objects, if any.

At step 702, embedded object level is initialized to zero (0). Embedded object level may represent a current embedded object depth. In following processing, a specified MAX embedded object level may be enforced to avoid infinite recursion with respect to embedded objects, or more generally, to avoid exceeding an undesired maximum depth.

In connection with following description, steps 706-742 of FIGS. 13-14 are included in WRITE OBJECT processing 701a-b. WRITE OBJECT may represent processing performed by a body of code or instructions executed whereby the body of code may be included in a function, routine, method and the like. In the processing, a recursive flow description is provided to describe one way in which embedded object processing may be performed. However, other variations will be appreciated by those skilled in the art. For example, processing may also be performed in an iterative manner using control loops.

At step 704, the object's ID and TYPE are received. At step 706, the TYPE may be mapped to a corresponding one of the arrays/lists of object type IDs (e.g., one of the arrays or lists as in 201). Subsequently, the ID which is included in the selected array or list may be mapped to a corresponding object structure such as one including object information in a JSON file. Step 704 may include determining the corresponding JSON file for the object TYPE and reading the object's information for processing. At step 708, the next object property in the received data to be written is determined as the current object property. At step 710, the current object property's name-value pair may be obtained from the data to be written. At step 712, a determination is made as to whether the "Name" of the name-value pair matches an object type. If step 712 evaluates to no, control proceeds to step 714 to write the name-value pair as the current object property and associated value in the data storage configuration data of the data store 121 used by the simulator. At step 716, a determination is made as to whether all object properties of the current object have been processed. If step 716 evaluates to no, control proceeds to step 708, and otherwise, control proceeds to step 718 to return.

If step 712 evaluates to yes, control proceeds to step 720 to determine the object model definition file mapped to the object type=TYPE as received in step 704. At step 722, a set of information (e.g., 802a) from the object model definition file is determined which includes an object property (e.g., 803a) matching the previously matched object TYPE (e.g., object type matched in step 712). At step 724, the type information (e.g., 803b) for the matched object type is obtained from the matching set of information. At step 730, a determination is made as to whether the type information read from the object model definition file in step 724 denotes an object type for an embedded object. If step 730 evaluates to no, control proceeds to step 732 whereby it is determined that the current object property is not a reference to an embedded object. Step 732 includes performing processing to write the current name-value pair (e.g., as obtained from the received data to be written) as the current object property and associated value in the data storage configuration information of the data store 121 as used by the simulator 106. Control then proceeds to step 716.

If step 730 evaluates to yes, control proceeds to step 734 whereby it is determined that the current object property having the current name-value pair is a reference to an embedded object. The "value" of the name-value pair is used as an object ID for the identified object type (e.g., object type denoted by type information for the object property as in object model definition file). Step 734 includes writing the current name-value pair as the current object property and associated value to the data storage configuration information used by the simulator 106.

At step 736, the embedded object level is incremented by 1. At step 738, a determination is made as to whether the current embedded object level exceeds the MAX allowable embedding level. If step 738 evaluates to yes, control proceeds to step 740 to return an error. It step 738 evaluates to no, control proceeds to step 742 to perform processing to write the embedded object information by performing a recursive call to WRITE OBJECT for the embedded object as referenced by the current object property. Step 742 includes recursively invoking the WRITE OBJECT processing as represented by 701a and 701b to perform such processing for the embedded object. From step 742, control proceeds to step 716.

An embodiment may implement the techniques herein using code executed by a processor. For example, an embodiment may implement the techniques herein using code which is executed by a processor of the data storage system. As will be appreciated by those skilled in the art, the code may be stored on the data storage system on a computer-readable storage medium (also referred to as computer readable medium) having any one of a variety of different forms including volatile and nonvolatile, removable and non-removable media implemented in any method or technology for storage of information such as computer readable instructions, data structures, program modules or other data. Computer-readable storage media, or computer-readable medium, includes, but is not limited to, RAM, ROM, EEPROM, flash memory or other memory technology, CD-ROM, (DVD) or other optical storage, magnetic cassettes, magnetic tape, magnetic disk storage or other magnetic storage devices, or any other medium which can be used to store the desired information and which can be accessed by a processor.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for processing a request comprising:
   generating, using a processor, data storage system configuration information used by a simulator simulating a data storage system configuration, wherein the data storage system configuration information includes a plurality of object types;
   receiving, using a processor, a request to perform an operation with respect to the data storage system configuration simulated by the simulator, said request identifying an object included in the data storage system configuration information used by the simulator in simulating the data storage system configuration, wherein said operation of said request includes requesting a modification of the data storage system configuration that is simulated; and
   performing, using a processor, first processing to simulate the request using the data storage system configuration information, wherein simulating the request includes simulating the modification of the data storage system configuration without sending the request to a data storage system and by modifying the data storage system configuration information denoting the data storage system configuration simulated, wherein the object includes a first object property and the data storage system configuration information includes a first name-value pair specifying the first object property of the object, the first name-value pair including a first name identifying the first object property and including a first value, the first name-value pair denoting that the first object property of the first object has the first value in the data storage system configuration simulated, wherein the object is a first object type of the plurality of object types and an object model definition file describes objects of the first object type and includes a second name-value pair for the first object property, wherein a second name of the second name-value pair matches the first name of the first name-value pair and a second value of the second name-value pair specifies a type of the first object property, said first processing including:
   determining, using a processor at run time while processing the request, whether the first object property of the object is a reference to a first embedded object, wherein said determining further comprises:
   determining whether the second value of the second name-value pair of the object model definition file matches one of the plurality of object types; and
   responsive to determining that the second value of the second name-value pair of the object model definition file matches one of the plurality of object types, determining that the first value of the first name-value pair denotes a reference to the first embedded object of the matching one of the plurality of object types.

2. The method of claim 1, wherein the request includes requesting to read first information regarding a current configuration of the data storage system, wherein simulation of the request includes reading at least some of the data storage system configuration information, and the first processing further includes:
   responsive to determining that the object includes the first object property that is a reference to the first embedded object, performing processing to retrieve object properties and associated values of the first embedded object and to include retrieved object properties and associated values of the first embedded object in information returned to a sender which issued the request.

3. The method of claim 1, wherein the request includes requesting to perform any of a get operation returning information regarding the data storage system configuration to a user interface for display, a create operation to create a new instance of an entity in the data storage system configuration, an update operation to update an existing instance of an entity in the data storage system configuration, and a delete operation to delete an existing instance of an entity in the data storage system configuration.

4. The method of claim 1, wherein the simulator simulates requests in connection with performing a data storage management operation, said simulator performing processing to simulate the requests including the request as if performed by the data storage system in accordance with the data storage system configuration information simulating at least some entities of a current configuration of the data storage system.

5. The method of claim 4, wherein the data storage system configuration information used to simulate the current configuration of the data storage system uses an object model and includes an object for each of a plurality of logical and physical entities of the data storage system simulated.

6. The method of claim 5, wherein the object model includes the plurality of object types, each of said plurality of logical and physical entities is one of the plurality of object types, and wherein said plurality of object types includes any of a physical storage device, a logical storage device, a RAID (redundant array of independent disks) group, a storage group, a physical component of the data storage system simulated, a pool, and a logical component of the data storage system simulated.

7. The method of claim 1, wherein the request includes requesting to write first information regarding a current configuration of the data storage system, wherein simulation of the request to simulate updating the current configuration is performed by writing at least some of the data storage system configuration information, and the first processing further includes:
   responsive to determining that the object includes the first object property that is a reference to the first embedded object, performing processing to write one or more property values corresponding to one or more object properties of any of the object and the first embedded object.

8. The method of claim 1, wherein the data storage system configuration information includes a plurality of files, each of the plurality of object types corresponding to one of the plurality of files whereby said one file provides object properties and associated object property values for objects of said each object type included in the data storage system configuration information.

9. The method of claim 8, wherein each of the plurality of object types identifies a different object type corresponding to a type of entity simulated using the data storage system configuration information.

10. The method of claim 8, wherein each of the plurality of object types has a corresponding object model definition file used in determining whether a property of a first object of said each object type is a reference to an embedded object.

11. A non-transitory computer readable medium comprising code stored thereon that, when executed, performs a method for processing a request:
  generating data storage system configuration information used by a simulator simulating a data storage system configuration, wherein the data storage system configuration information includes a plurality of object types;
  receiving a request to perform an operation with respect to the data storage system configuration simulated by the simulator, said request identifying an object included in the data storage system configuration information used by the simulator in simulating the data storage system configuration, wherein said operation of said request includes requesting a modification of the data storage system configuration that is simulated; and
  performing first processing to simulate the request using the data storage system configuration information, wherein simulating the request includes simulating the modification of the data storage system configuration without sending the request to a data storage system and by modifying the data storage system configuration information denoting the data storage system configuration simulated, wherein the object includes a first object property and the data storage system configuration information includes a first name-value pair specifying the first object property of the object, the first name-value pair including a first name identifying the first object property and including a first value, the first name-value pair denoting that the first object property of the first object has the first value in the data storage system configuration simulated, wherein the object is a first object type of the plurality of object types and an object model definition file describes objects of the first object type and includes a second name-value pair for the first object property, wherein a second name of the second name-value pair matches the first name of the first name-value pair and a second value of the second name-value pair specifies a type of the first object property, said first processing including:
    determining, using a processor at run time while processing the request, whether the first object property of the object is a reference to a first embedded object, wherein said determining further comprises:
      determining whether the second value of the second name-value pair of the object model definition file matches one of the plurality of object types; and
      responsive to determining that the second value of the second name-value pair of the object model definition file matches one of the plurality of object types, determining that the first value of the first name-value pair denotes a reference to the first embedded object of the matching one of the plurality of object types.

12. The non-transitory computer readable medium of claim 11, wherein the request includes requesting to read first information regarding a current configuration of the data storage system, wherein simulation of the request includes reading at least some of the data storage system configuration information, and the first processing further includes:
  responsive to determining that the object includes the first object property that is a reference to the first embedded object, performing processing to retrieve object properties and associated values of the first embedded object and to include retrieved object properties and associated values of the first embedded object in information returned to a sender which issued the request.

13. The non-transitory computer readable medium of claim 11, wherein the request includes requesting to perform any of a get operation returning information regarding the data storage system configuration to a user interface for display, a create operation to create a new instance of an entity in the data storage system configuration, an update operation to update an existing instance of an entity in the data storage system configuration, and a delete operation to delete an existing instance of an entity in the data storage system configuration.

14. The non-transitory computer readable medium of claim 11, wherein the simulator simulates requests in connection with performing a data storage management operation, said simulator performing processing to simulate the requests including the request as if performed by the data storage system in accordance with the data storage system configuration information simulating at least some entities of a current configuration of the data storage system.

15. The non-transitory computer readable medium of claim 14, wherein the data storage system configuration information used to simulate the current configuration of the data storage system uses an object model and includes an object for each of a plurality of logical and physical entities of the data storage system simulated.

16. The non-transitory computer readable medium of claim 15, wherein the object model includes the plurality of object types, each of said plurality of logical and physical entities is one of the plurality of object types, and wherein said plurality of object types includes any of a physical storage device, a logical storage device, a RAID (redundant array of independent disks) group, a storage group, a physical component of the data storage system simulated, a pool, and a logical component of the data storage system simulated.

17. A system comprising:
  a memory comprising code stored thereon that, when executed, generates data storage system configuration information used by a simulator simulating a data storage system configuration, wherein the data storage system configuration information includes a plurality of object types;
  a data storage system including:
    a data store of configuration data indicating a current data storage configuration of the data storage system; and
    a first computer readable medium including code stored thereon, the first computer readable medium including code, that when executed, performs processing comprising:
      servicing command requests in connection with data storage system management operations; and
  a management system including a second computer readable medium with code of a data storage system management application thereon, the data storage management application including:
    code of a user interface that issues requests to first code;

said first code that receives requests from the user interface and determines at runtime whether to simulate received requests using said simulator, or whether to service the received requests by issuing the received requests to the data storage system for servicing in a non-simulation mode;

said simulator that simulates requests, said simulator simulating processing performed to service requests as if performed by the data storage system, said simulator using the data storage configuration information for simulating at least part of a data storage system configuration of the data storage system; and wherein the second computer readable medium further includes code, that when executed, performs processing comprising:

receiving a request to perform an operation with respect to the data storage system configuration simulated by the simulator, said request identifying an object included in the data storage system configuration information used by the simulator in simulating the data storage system configuration, wherein said operation of the first request includes requesting a modification of the data storage system configuration simulated by the simulator; and performing first processing to simulate the request using the data storage system configuration information, wherein simulating the request includes simulating the modification of the data storage system configuration without sending the request to said data storage system and by modifying the data storage system configuration information denoting the data storage system configuration simulated, wherein the object includes a first object property and the data storage system configuration information includes a first name-value pair specifying the first object property of the object, the first name-value pair including a first name identifying the first object property and including a first value, the first name-value pair denoting that the first object property of the first object has the first value in the data storage system configuration simulated, wherein the object is a first object type of the plurality of object types and an object model definition file describes objects of the first object type and includes a second name-value pair for the first object property, wherein a second name of the second name-value pair matches the first name of the first name-value pair and a second value of the second name-value pair specifies a type of the first object property, said first processing including:

determining, using a processor at run time while processing the request, whether the first object property of the object is a reference to a first embedded object, wherein said determining further comprises:

determining whether the second value of the second name-value pair of the object model definition file matches one of the plurality of object types; and responsive to determining that the second value of the second name-value pair of the object model definition file matches one of the plurality of object types, determining that the first value of the first name-value pair denotes a reference to the first embedded object of the matching one of the plurality of object types.

18. The method of claim 1, wherein the first embedded object is a first instance of a pool object, the data storage system configuration simulated comprises a first entity and a second entity that are both included in a same pool represented by the first embedded object, the first entity is represented by the object, the second entity is represented by a second object, and the first embedded object is embedded in each of the object and the second object whereby each of the object and the second object is linked to the first embedded object.

19. The method of claim 1, wherein said generating includes generating identifiers for each of the plurality of object types using a hash function, wherein the hash function maps each of the plurality of object types to a list including all identifiers of said each object type, and wherein the hash function maps a particular identifier of said each object type to a corresponding object instance of said each object type.

20. The method of claim 1, wherein the first embedded object is a single object instance that is referenced as an embedded object by a plurality of other properties of a plurality of other objects.

21. The method of claim 1, wherein the object includes a plurality of other properties and each of the plurality of other properties is represented using a different name-value pair including a name of said each other property and a value specifying a value of said each other property, and wherein the plurality of other properties includes at least one other property that does not reference an embedded object, and wherein the plurality of other properties are described in the object model definition file using a plurality of corresponding name-value pairs.

22. The method of claim 18, wherein the object is a first object including the first object property that is a reference to the first embedded object and wherein the second object included in the data storage system configuration information includes a second object property that is a reference to the first embedded object, wherein the first object property of the first object and the second object property of the second object each reference a same set of information indicating object properties and associated property values of the first embedded object.

* * * * *